(12) United States Patent
Chan

(10) Patent No.: US 11,280,355 B2
(45) Date of Patent: Mar. 22, 2022

(54) FLUID CONTROL DEVICE AND CONNECTOR FOR FLUID CONTROL DEVICE

(71) Applicant: SIW ENGINEERING PTE. LTD., Singapore (SG)

(72) Inventor: Chee-Wei Chan, Singapore (SG)

(73) Assignee: SIW Engineering PTE. LTD., Singapore (SG)

( * ) Notice: Subject to any disclaimer, the term of this patent is extended or adjusted under 35 U.S.C. 154(b) by 0 days.

(21) Appl. No.: 17/206,956

(22) Filed: Mar. 19, 2021

(65) Prior Publication Data

US 2021/0207623 A1 Jul. 8, 2021

Related U.S. Application Data

(62) Division of application No. 16/207,715, filed on Dec. 3, 2018, now Pat. No. 10,982,694.

(60) Provisional application No. 62/594,805, filed on Dec. 5, 2017.

(51) Int. Cl.
*F15B 13/08* (2006.01)
*H01L 21/67* (2006.01)

(52) U.S. Cl.
CPC .... *F15B 13/0817* (2013.01); *H01L 21/67017* (2013.01)

(58) Field of Classification Search
CPC ............... F15B 13/0817; Y10T 137/86493
See application file for complete search history.

(56) References Cited

U.S. PATENT DOCUMENTS

| | | | | |
|---|---|---|---|---|
| 3,072,148 A ‡ | 1/1963 | Carls | ................... | F15B 13/0814 137/596 |
| 3,457,943 A ‡ | 7/1969 | Minoru | ............... | F15B 13/0821 137/269 |
| 3,504,704 A ‡ | 4/1970 | Beckett | ................... | F16K 11/22 137/625.64 |
| 3,680,589 A ‡ | 8/1972 | Jeans | .................. | F15B 13/0814 137/884 |
| 3,756,274 A ‡ | 9/1973 | Wolfgramm | ........ | F15B 13/0821 137/561 R |
| 3,817,269 A ‡ | 6/1974 | Raymond | ........... | F15B 13/0817 137/269 |
| 4,711,268 A ‡ | 12/1987 | Coleman | ................. | F16K 11/22 137/597 |
| 4,748,897 A ‡ | 6/1988 | Hoge | .................. | F15B 13/0402 251/366 |
| 5,709,247 A ‡ | 1/1998 | Hutton | ................ | F15B 13/0814 137/597 |
| D410,398 S ‡ | 6/1999 | Hutton | | |
| 5,964,481 A ‡ | 10/1999 | Buch | ................... | F15B 13/0817 285/125.1 |
| 6,415,822 B1‡ | 7/2002 | Hollingshead | ........ | F16K 27/003 137/884 |

(Continued)

*Primary Examiner* — Kevin R Barss
(74) *Attorney, Agent, or Firm* — Muncy, Geissler, Olds & Lowe, P.C.

(57) ABSTRACT

The present invention relates to a fluid control device and a connector for the same. The connector includes a first unit and a second unit to form a connector in a particular shape. Thus, the connector and an adjacent connector can be stacked upon each other to allow simple disassembling. The present invention also provides a fluid control device including the connector.

4 Claims, 24 Drawing Sheets

(56) References Cited

U.S. PATENT DOCUMENTS

D578,549 S ‡ 10/2008 Nimberger
2015/0075660 A1 3/2015 Inada et al.

‡ imported from a related application

FLUID CONTROL DEVICE AND CONNECTOR FOR FLUID CONTROL DEVICE

CROSS REFERENCE TO RELATED APPLICATIONS

This application is a Divisional of co-pending application Ser. No. 16/207,715, filed on Dec. 3, 2018, for which priority is claimed under 35 U.S.C. § 120; and this application claims priority of U.S. Provisional Application No. 62/594,805, filed on Dec. 5, 2017, under 35 U.S.C. § 119(e), the entire contents of all of which are hereby incorporated by reference.

FIELD OF THE INVENTION

The present invention relates to a fluid control device and a connector thereof, and more particularly to a fluid control device that can be simply disassembled and assembled and has flexibility with high sealing performance.

BACKGROUND OF THE INVENTION

Fluid control devices are commonly applied in the semiconductor industry, and aim to supply gases for semiconductor manufacturing processes, including diffusion, etching, sputtering and the like. At present, a fluid control device mainly includes a plurality of apparatuses, such as a pressure reducing valve, a pressure gauge, a mass flow controller, a gas filter, a hand-operated valve, a first shut-off valve, a second shut-off valve and the like, and includes various connectors for connecting the fluid control apparatuses to form a channel allowing a fluid to flow smoothly.

Even if the fluid control devices have been widely applied to the semiconductor industry, there are still defects to be overcome. For example, since a variety of apparatuses are included in a fluid control device, the difficulty of assembling and disassembling the fluid control device is a problem to be solved. The solutions proposed currently include reducing the number of elements used in the fluid control device to achieve the effect of easy assembling.

For example, US patent No. US 2015/0075660 A1 discloses a fluid control apparatus providing a method for solving the assembling problem. The apparatus includes an upper stage having a plurality of fluid control devices arranged in series and a lower stage having a plurality of passage blocks that connect the fluid control devices on the upper stage. The adjacent passage blocks are connected to one another through inverted U-shaped pipes. Therefore, the apparatus is able to be easily constructed with a plurality of lines of passage blocks in parallel and a single line of passage blocks. The apparatus also has a reduced number of components and enables simple alteration such as increasing or decreasing the number of lines.

In addition, some of fluids flowing through the fluid control device may be corrosive, so the corrosion resistance of the elements of the fluid control device should be improved and the difficulty of cleaning the fluid control device should also be considered. Furthermore, the problem of leakage may occur frequently when a fluid flows in the fluid control device, and especially when a flowing gas is dangerous or harmful to human body, the fluid leakage problem needs to be avoided carefully.

In view of this, there is an urgent need to develop a novel fluid control device capable of overcoming the above defects to meet the requirements in the industry.

SUMMARY OF THE INVENTION

A main objective of the present invention is to solve the problem that a conventional fluid control device is not easy to disassemble or assemble.

Another objective of the present invention is to overcome the defects that a gas channel is prone to particle remaining therein and not easy to clean in a conventional connector for a fluid control device.

A further another objective of the present invention is to reduce the risks of leakage of a gas during the process of flowing in a fluid control device.

To achieve the above objectives, an embodiment of the present invention provides a connector for a fluid control device that includes at least two fluid flowing through holes. The connector includes: a first unit having an upper surface, a lower surface opposite to the upper surface, a first fluid flowing through hole formed in the upper surface, a second fluid flowing through hole formed in the upper surface, and a first channel that communicates the first fluid flowing through hole with the second fluid flowing through hole and is formed to extend through the first unit; and a second unit disposed under the first unit and including a mounting block protruding from a portion of the lower surface of the first unit and a first depression portion adjacent to the other portion of the lower surface and the mounting block.

To achieve the above objectives, an embodiment of the present invention provides a connector for a fluid control device that includes at least three fluid flowing through holes. The connector includes a first unit having an upper surface, a lower surface opposite to the upper surface, a first fluid flowing through hole formed in the upper surface, a second fluid flowing through hole formed in the upper surface, and a fourth fluid flowing through hole formed in the upper surface, with a first channel being disposed between the first fluid flowing through hole and the fourth fluid flowing through hole to communicate the first fluid flowing through hole with the fourth fluid flowing through hole; an extension unit that protrudes outwards from a side end of the first unit, the extension unit including a third fluid flowing through hole, and a second channel being disposed between the third fluid flowing through hole and the second fluid flowing through hole to communicate the second fluid flowing through hole with the third fluid flowing through hole; and a second unit disposed under the first unit and including a mounting block protruding from a portion of the lower surface of the first unit and a first depression portion adjacent to the other portion of the lower surface and the mounting block.

A further another embodiment of the present invention provides a connector including at least four fluid flowing through holes. The connector includes: a first unit having an upper surface, a lower surface opposite to the upper surface, a first fluid flowing through hole formed in the upper surface, a second fluid flowing through hole formed in the upper surface, a fourth fluid flowing through hole formed in the upper surface, a fifth fluid flowing through hole formed in the upper surface, and a sixth fluid flowing through hole formed in the upper surface, where a first channel is disposed between the first fluid flowing through hole and the fifth fluid flowing through hole to communicate the first fluid flowing through hole with the fifth fluid flowing through hole, and a second channel is disposed between the second fluid flowing through hole and the sixth fluid flowing through hole to communicate the second fluid flowing through hole with the sixth fluid flowing through hole; an extension unit that protrudes outwards from a side end of the first unit, the extension unit including a third fluid flowing through hole, and a third channel being disposed between the third fluid flowing through hole and the fourth fluid flowing through hole to communicate the third fluid flowing through hole with the fourth fluid flowing through hole; and a second unit disposed under the first unit and including a mounting block protruding from a portion of the lower surface of the first unit and a first depression portion adjacent to the other portion of the lower surface and the mounting block.

A further another embodiment of the present invention provides a connector including at least six fluid flowing through holes. The connector includes: a first unit having an upper surface, a lower surface opposite to the upper surface, a first fluid flowing through hole formed in the upper surface, a second fluid flowing through hole formed in the upper surface, a fourth fluid flowing through hole formed in the upper surface, a fifth fluid flowing through hole formed in the upper surface, and a sixth fluid flowing through hole formed in the upper surface, where a first channel is disposed between the first fluid flowing through hole and the fifth fluid flowing through hole to communicate the first fluid flowing through hole with the fifth fluid flowing through hole, and a second channel is disposed between the second fluid flowing through hole and the sixth fluid flowing through hole to communicate the second fluid flowing through hole with the sixth fluid flowing through hole; an extension unit that protrudes outwards from a side end of the first unit, the extension unit including a third fluid flowing through hole, and a third channel being disposed between the third fluid flowing through hole and the fourth fluid flowing through hole to communicate the third fluid flowing through hole with the fourth fluid flowing through hole; and a second unit disposed under the first unit and including a mounting block protruding from a portion of the lower surface of the first unit and a first depression portion adjacent to the other portion of the lower surface and the mounting block.

The present invention also provides a connector module for the fluid control device. The connector module includes a plurality of connecting blocks that are arranged in an axial direction. Each of the connecting blocks includes an upper half portion that includes at least one fluid inlet, at least one fluid outlet, and at least one connecting channel communicating the fluid inlet with the fluid outlet and extending in a horizontal direction, and a lower half portion that is provided with a depression portion and a tongue portion extending and protruding from the depression portion along the axial direction, where the connecting channel is above an upper surface of the tongue portion. Adjacent connecting blocks are accommodated in the depression portion through the tongue portion to be connected to each other.

The present invention further provides a connector module for the fluid control device. The connector module includes a plurality of connecting blocks that are arranged in an axial direction. Each of the connecting blocks includes at least one fluid inlet, at least one fluid outlet, and at least one connecting channel communicating the fluid inlet with the fluid outlet and extending in a horizontal direction to be separated from a bottom surface of the connecting block by a height, where a protruding first tongue portion is formed at one end of the connecting block, and a depression portion is formed at the other end of the connecting block. Adjacent connecting blocks are connected to each other by accommodating the first tongue portion in the depression portion.

The present invention further provides a fluid control device including:
a base;
a connector module disposed on the base and including:
a first connector including:
a first unit having a first upper surface, a first lower surface opposite to the first upper surface, a first fluid flowing through hole formed in the first upper surface, a second fluid flowing through hole formed in the first upper surface, and a first channel that communicates the first fluid flowing through hole with the second fluid flowing through hole and extends through the first unit;
a second unit disposed under the first unit and including a first mounting block protruding from a portion of the first lower surface of the first unit, and a first depression portion adjacent to the other portion of the lower surface and the first mounting block; and
a second connector including:
a third unit having a second upper surface, a second lower surface opposite to the second upper surface, a third fluid flowing through hole formed in the second upper surface, a fourth fluid flowing through hole formed in the second upper surface, and a second channel that communicates the third fluid flowing through hole with the fourth fluid flowing through hole and extends through the third unit; and
a fourth unit disposed under the third unit and including a second mounting block protruding from a portion of the second lower surface of the third unit, a second depression portion adjacent to the other portion of the second lower surface and the second mounting block, and a tongue portion far away from the second depression portion, where the first connector is abutted against the second connector by accommodating the tongue portion of the fourth unit in the first depression portion of the second unit; and
a fluid control element that is fastened to the base through the connector module and bridged across the first connector and the second connector.

The present invention further provides a fluid control device including:
a base extending in an axial direction;
a fluid control element disposed above the base and provided with an outlet and an inlet;
a connector module disposed between the fluid control element and the base and including:
a plurality of connecting blocks that are arranged in the axial direction, each of the plurality of connecting blocks including:
a fluid channel including a fluid inlet and a fluid outlet that are formed in an upper surface of the connecting block, and a U-shaped connecting channel that communicates the fluid inlet with the fluid outlet;
an upper tongue portion formed to protrude from one end of the connecting block and provided with a first fixing hole extending through a bottom surface of the upper tongue portion; and
a lower tongue portion formed to protrude from the other end of the connecting block and provided with a second fixing hole extending through a top surface of the lower tongue portion;
a fastener that is put through the first fixing hole of the upper tongue portion of the connecting block and the second fixing hole of the lower tongue portion of the adjacent connecting block;
where the fluid control element is bridged across two adjacent connecting blocks, and the outlet of the fluid control element is connected to the fluid inlet of one of the connecting blocks, while the inlet of the fluid control element is connected to the fluid outlet of another connecting block.

The present invention further provides a fluid control device including:

a base extending in an axial direction;

a fluid control element disposed above the base and provided with an outlet and an inlet;

a connector module disposed between the fluid control element and the base and including:

a plurality of connecting blocks that are arranged in the axial direction, each of the plurality of connecting blocks including:

a fluid channel including a fluid inlet and a fluid outlet that are formed in an upper surface of the connecting block, and a U-shaped connecting channel that communicates the fluid inlet with the fluid outlet;

an upper tongue portion formed to protrude from one end of the connecting block and provided with a first fixing hole extending through a bottom surface of the upper tongue portion; and a lower tongue portion formed to protrude from the other end of the connecting block and provided with a second fixing hole extending through a top surface of the lower tongue portion and a third fixing hole extending through a bottom surface of the lower tongue portion; and an upper fastener that is put through the first fixing hole of the upper tongue portion of the connecting block and the second fixing hole of the lower tongue portion of the adjacent connecting block; and a lower fastener that is put through the third fixing hole of the lower tongue portion of the connecting block and the base;

where the fluid control element is bridged across two adjacent connecting blocks, and the outlet of the fluid control element is connected to the fluid inlet of one of the connecting blocks, while the inlet of the fluid control element is connected to the fluid outlet of another connecting block.

Therefore, the present invention, compared with the prior art, can achieve the following effects:

(1) The fluid control device of the invention is connected through a connector in a particular shape. The connector can be simply stacked upon an adjacent connector to allow for simple disassembling or assembling, and then the problem that the conventional fluid control device is not easy to disassemble or assemble is solved. Based on the above connector, the embodiment of the fluid control device is allowed to be modularized. Through combination of different connectors, flexible combination with various fluid control elements can be realized.

(2) The connector design of the present invention allows a fluid to flow through a fluid channel in a single connector rather than a fluid channel composed of a plurality of secondary channels connected to one another when passing from a fluid control element through the connector to an adjacent fluid control element. In other words, assembling of adjacent connectors does not involve joining of fluid channels, thereby decreasing the interface of the fluid channel, reducing the probability of fluid leakage, and having good sealing performance.

(3) The fluid flowing through holes of the present invention and/or the channels between such fluid flowing through holes each have a mirror surface, so that the problem of particle remaining when a fluid flowing therethrough can be effectively solved.

DETAILED DESCRIPTION OF THE PREFERRED EMBODIMENTS

Figure 1A:
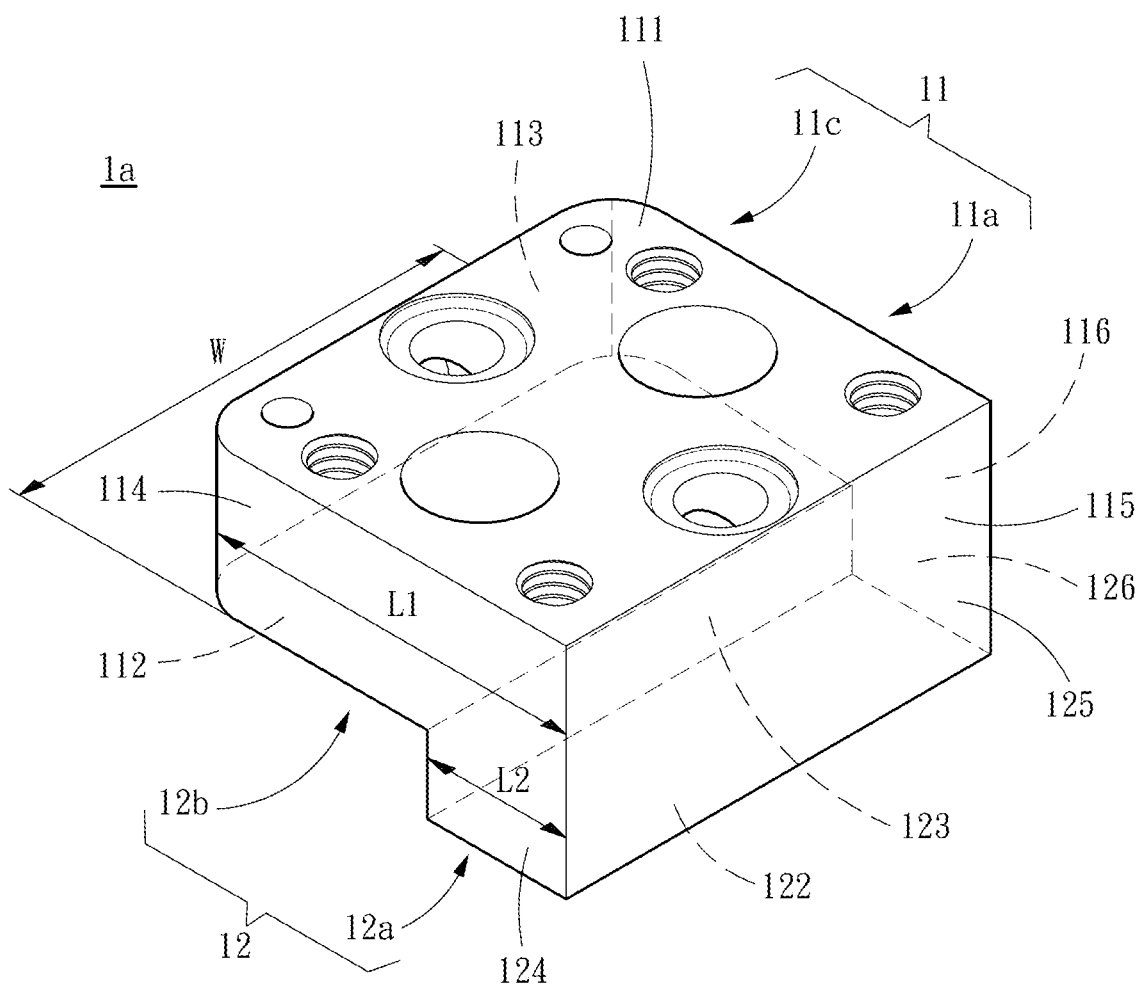
FIG. 1A is a three-dimensional diagram of a first embodiment of a two-port connector of the present invention.

Details and technical contents of the present invention will be illustrated in conjunction with the drawings.

A fluid control device of the present invention includes a plurality of fluid control elements arranged into a single line, and a plurality of connectors corresponding to the plurality of fluid control elements, and each fluid control element is connected to the corresponding connector so that a fluid flows between the connected fluid control element and connector.

The plurality of fluid control elements included in the fluid control device of the present invention are not particularly limited and can be chosen arbitrarily as required. In a specific embodiment, each fluid control element is selected from a group consisting of a pressure reducing valve, a pressure gauge, a mass flow controller, a filter, a hand-operated valve, a two-port shut-off valve, a three-port shut-off valve, a high-cleanness pressure regulator valve, a pressure sensor and combinations thereof. More particularly, the group may consist of a hand-operated valve, a two-port shut-off valve, a three-port shut-off valve, a high-cleanness pressure regulator valve, a pressure sensor, a filter, a two-port shut-off valve, a mass flow controller, a three-port shut-off valve, and a two-port shut-off valve.

Connectors for the fluid control device of the present invention may be classified into a two-port connector, a three-port connector, a connector with more than four ports, and a connecting piece according to the number of gas channel ports thereof. Such connectors will be illustrated below. In addition, such connectors each include a plurality of units, each unit including an upper surface, a lower surface, a first side surface, a second side surface, a third side surface, a fourth side surface, etc. For the convenience of description, surfaces in the same orientations will be described with the same name and different reference numerals for the purpose of distinction.

Two-Port Connectors

A two-port connector of the present invention refers to a connector with two fluid flowing through holes, one being a fluid inlet and the other being a fluid outlet.

Figure 1B:
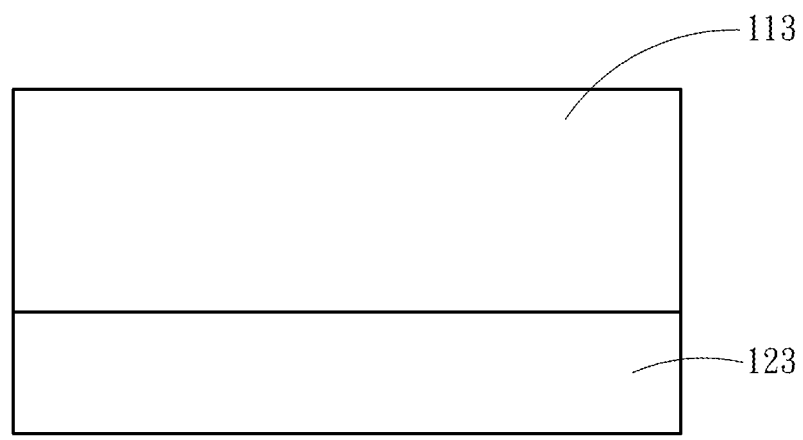
FIG. 1B is a left view of the first embodiment of the two-port connector of the present invention.

FIGS. 1A-F show a first embodiment 1a of a two-port connector of the present invention. With reference to FIG. 1A and FIG. 1B, the two-port connector 1a is provided with a first unit 11 and a second unit 12. The first unit 11 is disposed on the second unit 12.

The first unit 11 includes a first mounting block 11a and a first tongue portion 11c, and the first unit 11 is further provided with an upper surface 111, a lower surface 112 opposite to the upper surface 111, and a first side surface 113, a second side surface 114, a third side surface 115 and a fourth side surface 116 that are connected to the upper surface 111 and the lower surface 112, respectively. The first side surface 113 is disposed corresponding to the third side surface 115, while the second side surface 114 is disposed corresponding to the fourth side surface 116. The second unit 12 includes a second mounting block 12a and a second depression portion 12b. The second mounting block 12a protrudes from a portion of the lower surface 112 of the first unit 11, and due to the existence of the second mounting block 12a, the other portion of the lower surface 112 of the first unit 11 is depressed inwards into a second depression portion 12b that is adjacent between the other portion of the lower surface 112 and the second mounting block 12a, as shown in FIG. 1E. The second unit 12 is provided with a lower surface 122, and a first side surface 123, a second side surface 124, a third side surface 125 and a fourth side surface 126 that are separately connected to the lower surface 122. The first side surface 123 is disposed corresponding to the third side surface 125, and the second side surface 124 is disposed corresponding to the fourth side surface 126.

The first unit 11 and the second unit 12 have the same width W. The length L1 of the first unit 11 is greater than the length L2 of the second unit 12. The first unit 11 and the second unit 12 are of an integrally formed structure. The third side surface 115 of the first unit 11 is flush with the third side surface 125 of the second unit 12 to form an integrally formed surface. Similarly, the second side surface 114 of the first unit 11 and the second side surface 124 of the second unit 12 are molded into an integrally formed surface, and the fourth side surface 116 of the first unit 11 and the fourth side surface 126 of the second unit 12 are molded into an integrally formed surface.

Figure 1C:
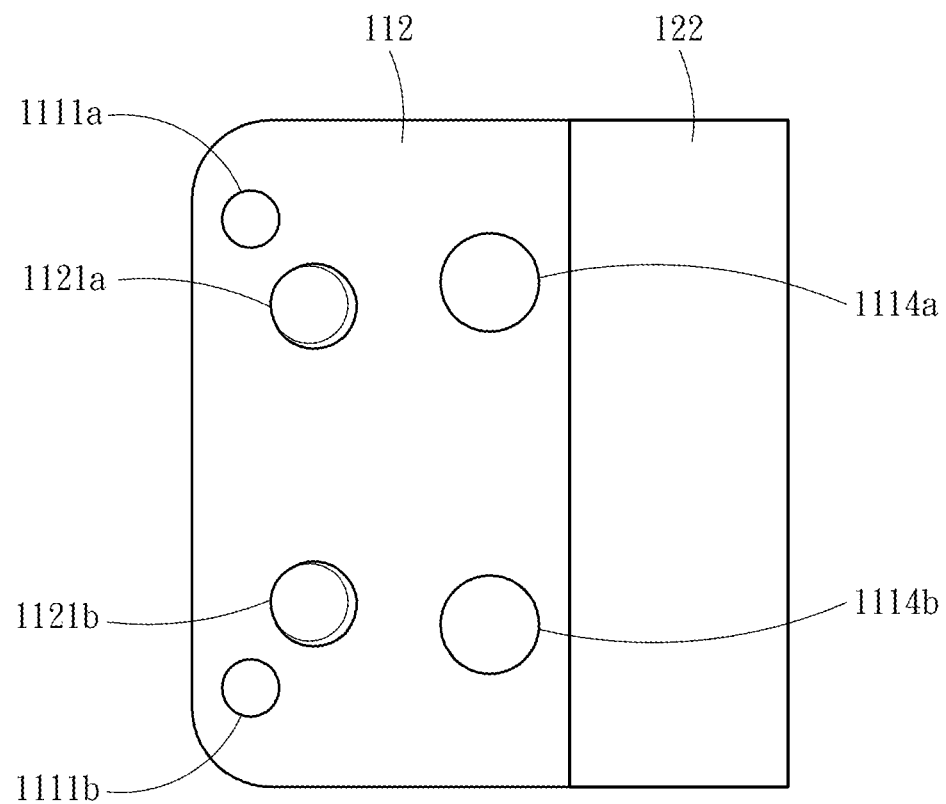
FIG. 1C is a bottom view of the first embodiment of the two-port connector of the present invention.
Figure 1D:
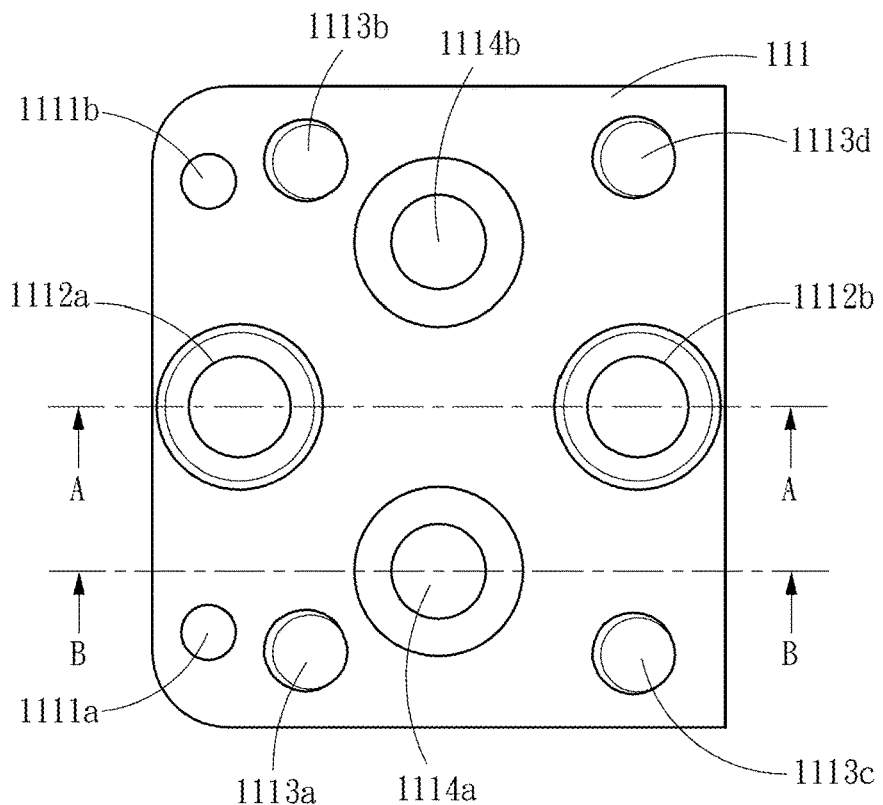
FIG. 1D is a top view of the first embodiment of the two-port connector of the present invention.
Figure 1E:
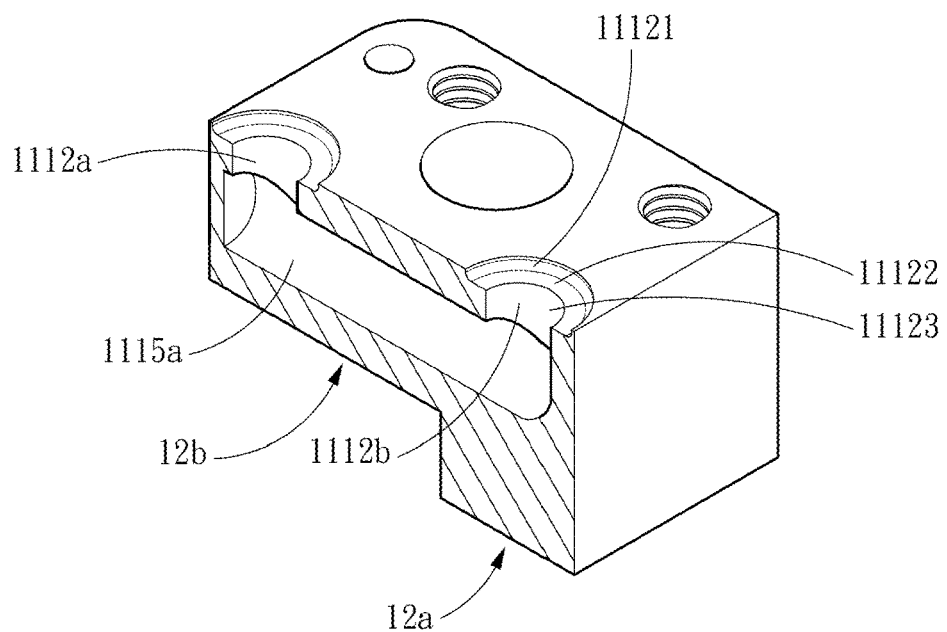
FIG. 1E is an A-A section view of FIG. 1D.
Figure 1F:
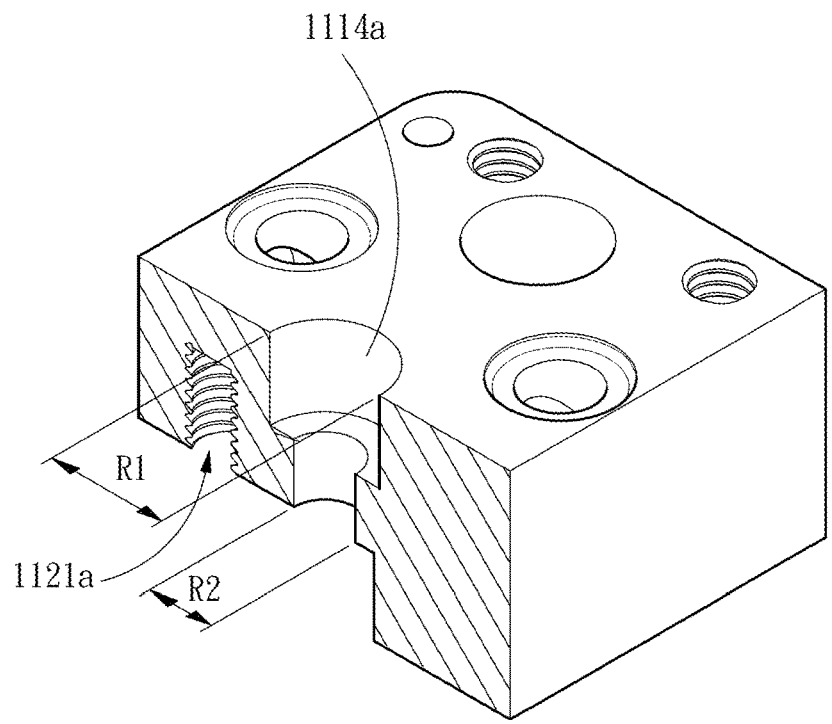
FIG. 1F is a B-B section view of FIG. 1D.

With continuous reference to FIG. 1C, FIG. 1D and FIG. 1F, the first unit 11 includes a first locating pin hole 1111a, a second locating pin hole 1111b, a first fluid flowing through hole 1112a, a second fluid flowing through hole 1112b, a first threaded hole 1113a, a second threaded hole 1113b, a third threaded hole 1113c, a fourth threaded hole 1113d, a first lower threaded hole 1121a, a second lower threaded hole 1121b, a first bolt hole 1114a, and a second bolt hole 1114b. The first locating pin hole 1111a and the second locating pin hole 1111b are disposed at a side of the upper surface 111 that is close to the first side surface 113, and are through holes extending through the upper surface 111 and the lower surface 112.

The first fluid flowing through hole 1112a and the second fluid flowing through hole 1112b are disposed at sides of the upper surface 111 that are close to the first side surface 113 and the third side surface 115, respectively, where the first fluid flowing through hole 1112a is disposed between the first locating pin hole 1111a and the second locating pin hole 1111b, and the second fluid flowing through hole 1112b is disposed between the third threaded hole 1113c and the fourth threaded hole 11113d. Referring to FIG. 1E, a first channel 1115a is disposed between the first fluid flowing through hole 1112a and the second fluid flowing through hole 1112b to communicate the first fluid flowing through hole 1112a with the second fluid flowing through hole 1112b. In this embodiment, the first channel 1115a extends from an end of the first unit 11 that is close to the second mounting block 12a to an end of the first unit 11 that is close to the second depression portion 12b, and may also be deemed to extend from an end of the first unit 11 that is close to the third side surface 115 to an end of the first unit 11 that is close to the first side surface 113. To avoid that a fluid remains in the first channel 1115a when flowing therethrough, the first channel 1115a may be subjected to a treatment to have a mirror surface. The above-mentioned treatment, for example, may include firstly forming an opening that communicates with the first channel 1115a in the first side surface 113 and performing a burnishing treatment on the first channel 1115a to allow the first channel 1115a to have a mirror surface, and then plugging the opening by welding.

The first threaded hole 1113a, the second threaded hole 1113b, the third threaded hole 1113c, the fourth threaded hole 1113d, the first lower threaded hole 1121a and the second lower threaded hole 1121b are all threaded blind holes, i.e., non-penetrating holes, where the first threaded hole 1113a and the second threaded hole 1113b are disposed at a side of the upper surface 111 that is close to the first side surface 113, and the first threaded hole 1113a is adjacent to the first locating pin hole 1111a, while the second threaded hole 1113b is adjacent to the second locating pin hole 1111b. The third threaded hole 1113c and the fourth threaded hole 1113d are disposed at a side of the upper surface 111 that is close to the third side surface 115, and the third threaded hole 1113c is close to the second side surface 114, while the fourth threaded hole 1113d is close to the fourth side surface 116. The first lower threaded hole 1121a and the second lower threaded hole 1121b are formed in the lower surface 112 and close to the first bolt hole 1114a and the second bolt hole 1114b.

Referring to FIG. 1E, in an embodiment of the present invention, the second fluid flowing through hole 1112b includes an enlarged portion 11121, a step surface 11122 and a channel portion 11123. An inner diameter of the enlarged portion 11121 is greater than that of the channel portion 11123. The step surface 11122 is connected between the enlarged portion 11121 and the channel portion 11123 and is a burnished mirror surface, so that a sealing effect can be achieved when the second fluid flowing through hole 1112b communicates with other fluid control element. Fluid flowing through holes in other embodiments and embodiments may be the same as above and will not be redundantly described below.

The first bolt hole 1114a and the second bolt hole 1114b are disposed at sides of the upper surface 111 that are close to the second side surface 114 and the fourth side surface 116, respectively. More particularly, the first bolt hole 1114a is disposed adjacent between the first threaded hole 1113a and the third threaded hole 1113c, and the second bolt hole 1114b is disposed adjacent between the second threaded hole 1113b and the fourth threaded hole 1113d. The first bolt hole 1114a and the second bolt hole 1114b are both through holes extending through the upper surface 111 and the lower surface 112, and a projection portion is disposed in each of the through holes, i.e., the first bolt hole 1114a and the second bolt hole 1114b, so that the through holes, i.e., the first bolt hole 1114a and the second bolt hole 1114b, have different diameters R1 and R2, where the diameter close to the upper surface 111 is R1, while the diameter close to the lower surface 112 is R2, and R1 is greater than R2, as shown in FIG. 1F.

Figure 2:
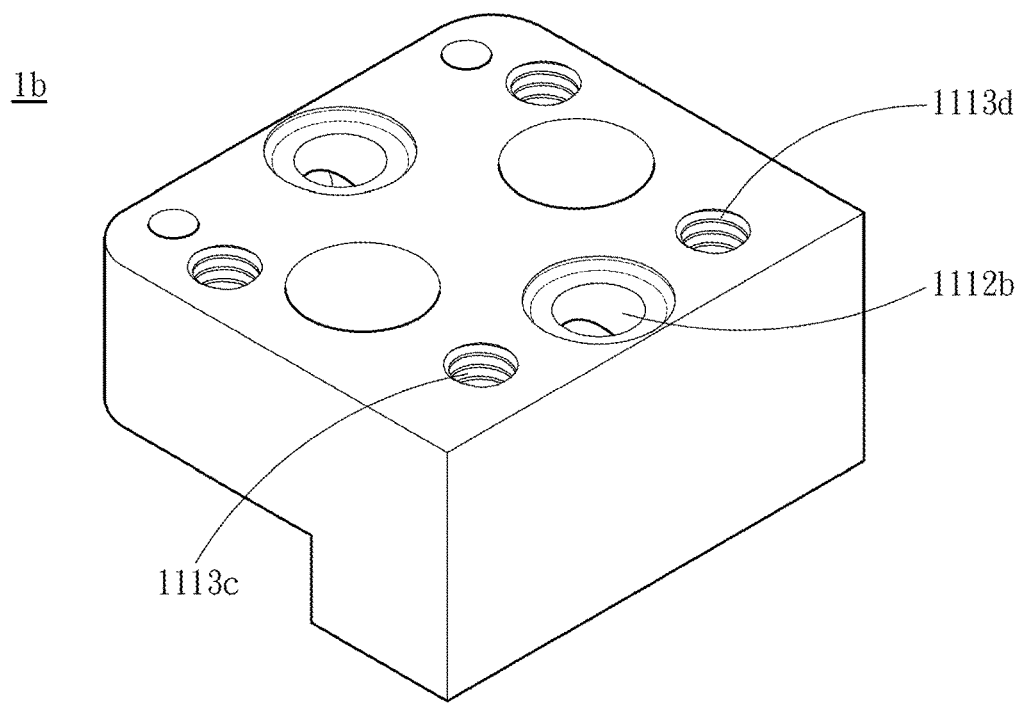
FIG. 2 is a three-dimensional diagram of a second embodiment of a two-port connector of the present invention.

As shown in FIG. 2, a two-port connector 1b of the present invention is the same as the first embodiment 1a as described above in other arrangements and structures, except that a distance between the third threaded hole 1113c and the fourth threaded hole 113d is shorter than that between the third threaded hole 1113c and the fourth threaded hole 113d in the first embodiment 1a.

Figure 3A:
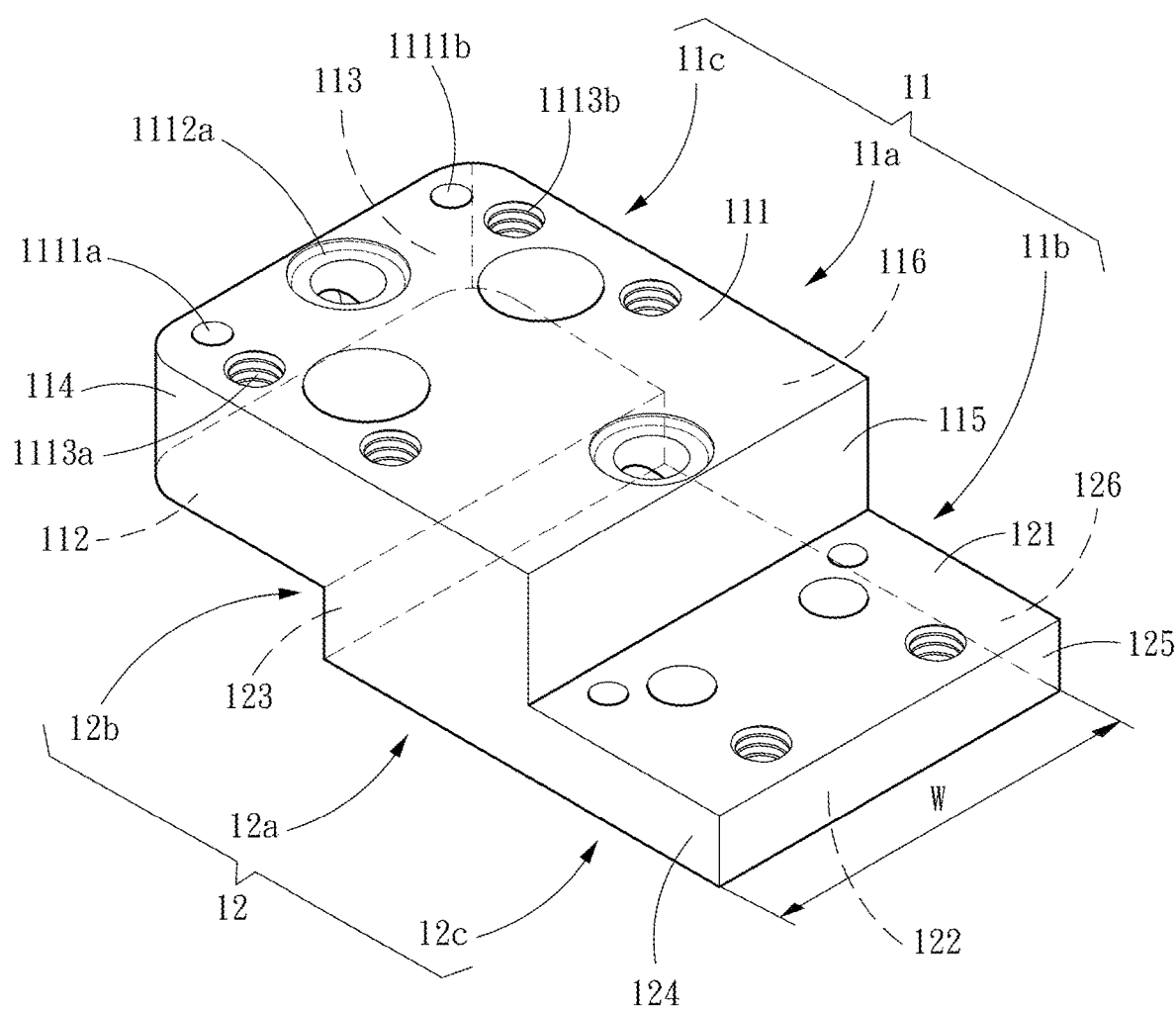
FIG. 3A is a three-dimensional diagram of a third embodiment of a two-port connector of the present invention.
Figure 3B:
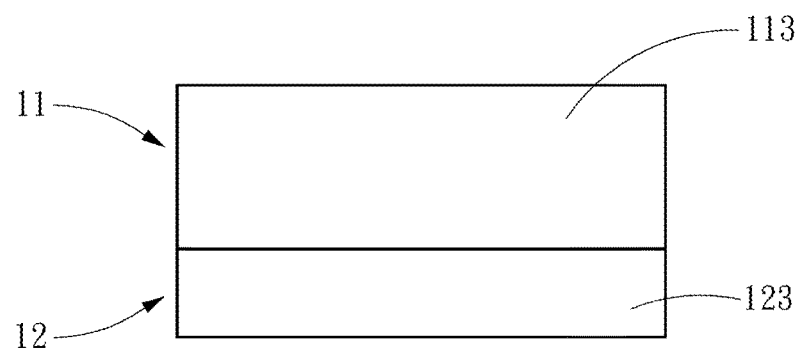
FIG. 3B is a left view of the third embodiment of the two-port connector of the present invention.
Figure 3C:
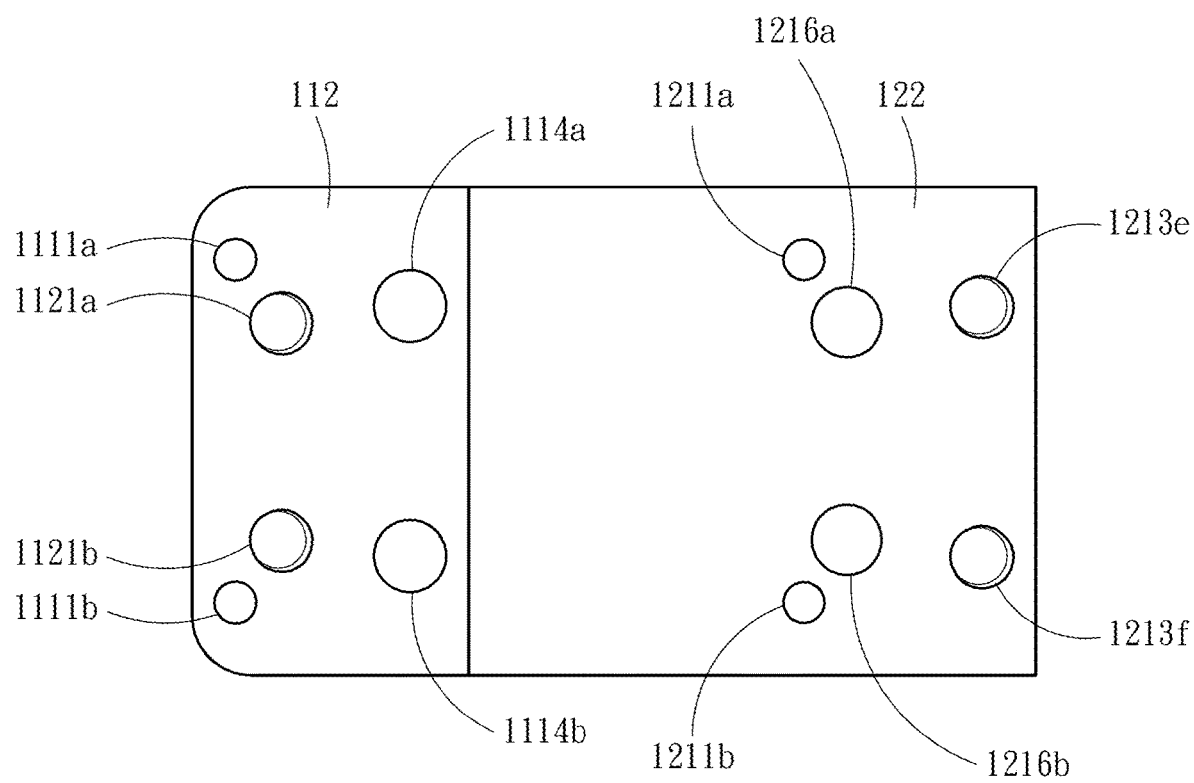
FIG. 3C is a bottom view of the third embodiment of the two-port connector of the present invention.
Figure 3D:
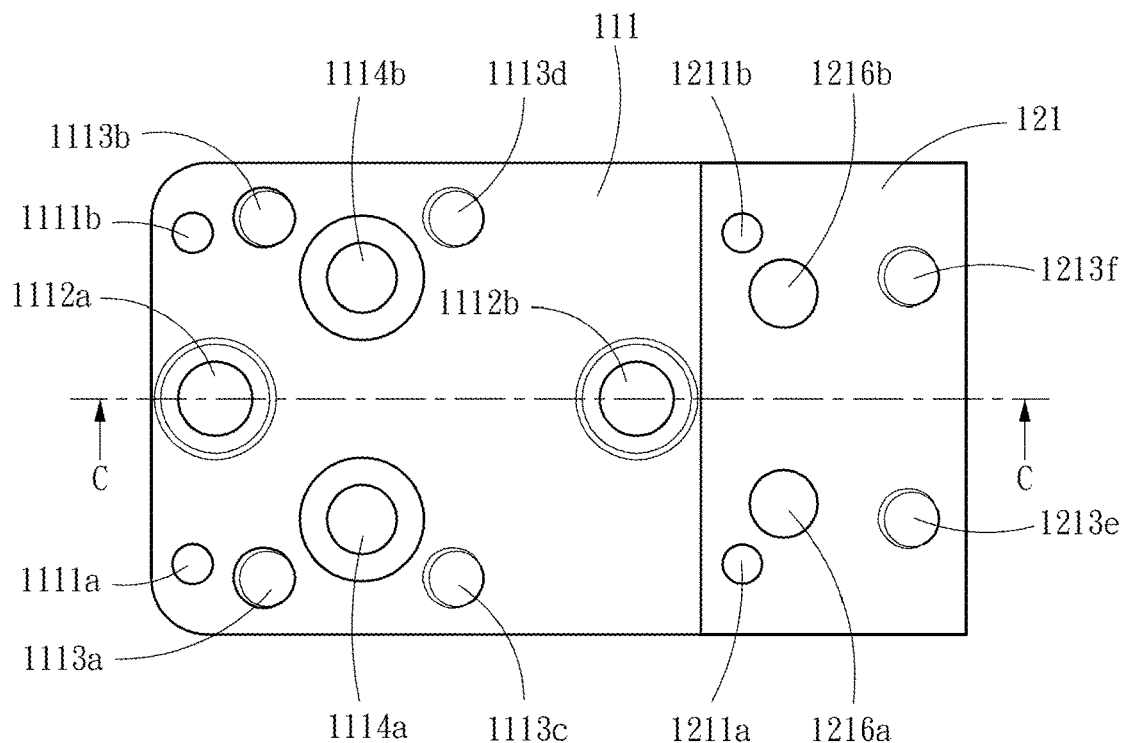
FIG. 3D is a top view of the third embodiment of the two-port connector of the present invention.
Figure 3E:
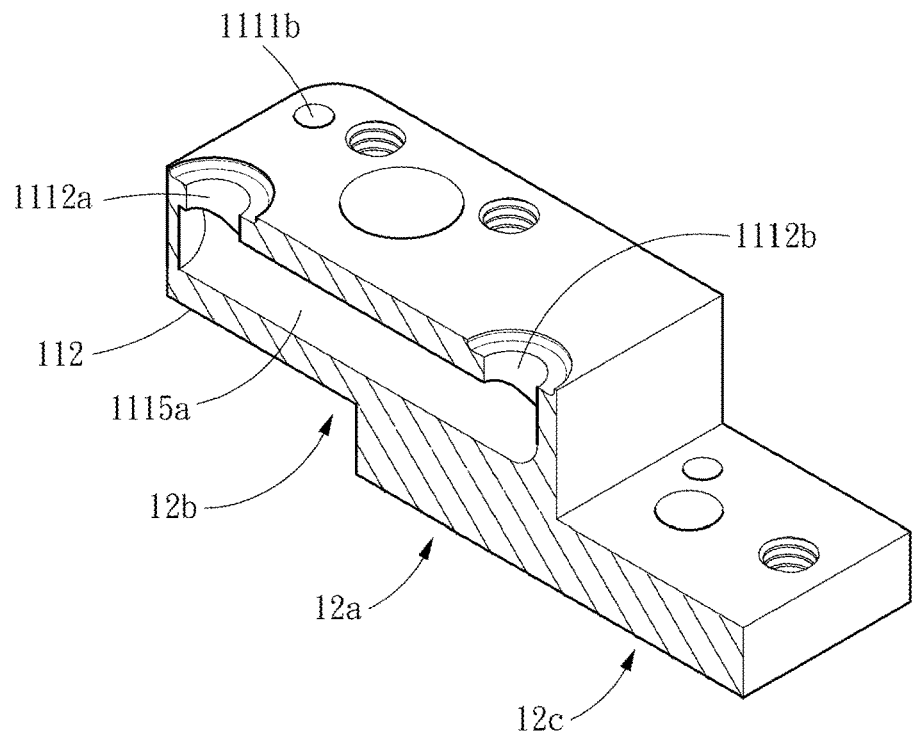
FIG. 3E is a C-C section view of FIG. 3D.

FIG. 3A-E show a third embodiment 1c of a two-port connector of the present invention. The two-port connector 1c has a first unit 11 and a second unit 12. The first unit 11 includes a first mounting block 11a, a first depression portion 11b and a first tongue portion 11c, and the first unit 11 further has an upper surface 111, a lower surface 112 opposite to the upper surface 111, and a first side surface 113, a second side surface 114, a third side surface 115 and a fourth side surface 116 that are connected to the upper surface 111 and the lower surface 112, respectively. The first side surface 113 is disposed corresponding to the third side surface 115, while the second side surface 114 is disposed corresponding to the fourth side surface 116. The second unit 12 includes a second mounting block 12a and a second depression portion 12b. The second mounting block 12a protrudes from a portion of the lower surface 112 of the first unit 11, and due to the existence of the second mounting block 12a, the other portion of the lower surface 112 of the first unit 11 is depressed inwards into a second depression portion 12b that is adjacent between the other portion of the lower surface 112 and the second mounting block 12a, as shown in FIG. 3E. The second tongue portion 12c extends from the second mounting block 12a toward a side far away from the second depression portion 12b and protrudes from the first unit 11. The second unit 12 is provided with an upper surface 121, a lower surface 122 opposite to the upper surface 121, and a first side surface 123, a second side surface 124, a third side surface 125 and a fourth side surface 126 that are connected to the upper surface 121 and the lower surface 122, respectively. The first side surface 123 is disposed corresponding to the third side surface 125, and the second side surface 124 is disposed corresponding to the fourth side surface 126.

In this embodiment, the first unit 11 and the second unit 12 are of an integrally formed structure. Specifically, the first unit 11 and the second unit 12 have the same width W. The second side surface 114 of the first unit 11 is flush with the second side surface 124 of the second unit 12 to form a Z-shaped plane, and the fourth side surface 116 of the first unit 11 is flush with the fourth side surface 126 of the second unit 12 to form a Z-shaped plane.

Referring to FIG. 3C and FIG. 3D, the first unit 11 further includes a first locating pin hole 1111a, a second locating pin hole 1111b, a first fluid flowing through hole 1112a, a second fluid flowing through hole 1112b, a first threaded hole 1113a, a second threaded hole 1113b, a third threaded hole 1113c, a fourth threaded hole 1113d, a first lower threaded hole 1121a, a second lower threaded hole 1121b, a first bolt hole 1114a, and a second bolt hole 1114b.

The first locating pin hole 1111a and the second locating pin hole 1111b are both through holes extending through the upper surface 111 and the lower surface 112. The first locating pin hole 1111a is located between the first threaded hole 1113a and the first side surface 113, and the second locating pin hole 1111b is located between the second threaded hole 1113b and the first side surface 113. The first fluid flowing through hole 1112a and the second fluid flowing through hole 1112b are disposed at sides of the upper surface 111 that are close to the first side surface 113 and the third side surface 115, respectively. A first channel 1115a is disposed between the first fluid flowing through hole 1112a and the second fluid flowing through hole 1112b to communicate the first fluid flowing through hole 1112a with the second fluid flowing through hole 1112b. In this embodiment, the first channel 1115a extends from an end of the first unit 11 that is close to the second mounting block 12a to an end of the first unit 11 that is close to the second depression portion 12b. To avoid that a fluid remains in the first channel 1115a when flowing therethrough, the first channel 1115a may be subjected to a treatment to have a mirror surface, as described above.

The first threaded hole 1113a, the second threaded hole 1113b, the third threaded hole 1113c, the fourth threaded hole 1113d, the first lower threaded hole 1121a and the second lower threaded hole 1121b are all threaded blind holes, where the first threaded hole 1113a and the second threaded hole 1113b are disposed at a side of the upper surface 111 of the first unit 11 that is close to the first side surface 113. The third threaded hole 1113c is disposed at a side of the upper surface 111 that is close to the second side surface 114, while the fourth threaded hole 1113d is close to the fourth side surface 116. In this embodiment, the first threaded hole 1113a, the second threaded hole 1113b and the second fluid flowing through hole 1112b are arranged appropriately as vertexes of an isosceles triangle. The first lower threaded hole 1121a and the second lower threaded hole 1121b are formed in the lower surface 112 and close to the first bolt hole 1114a and the second bolt hole 1114b.

The first bolt hole 1114a and the second bolt hole 1114b are both through holes extending through the upper surface 111 and the lower surface 112, and a projection portion is disposed in each of the through holes, so that the through holes, i.e., the first bolt hole 1114a and the second bolt hole 1114b, have different diameters R1 and R2, where the diameter close to the upper surface 111 is R1, while the diameter close to the lower surface 112 is R2, and R1 is greater than R2 (please refer to FIG. 1F for the structure of the bolt holes). In this embodiment, the first bolt hole 1114a is disposed between the first threaded hole 1113a and the third threaded hole 1113c, and the second bolt hole 1114b is disposed between the second threaded hole 1113b and the fourth threaded hole 1113d.

The second unit 12 further includes a first locating pin hole 1211a, a second locating pin hole 1211b, a first through hole 1216a, a second through hole 1216b, a fifth threaded hole 1213e, and a sixth threaded hole 1213f.

The first locating pin hole 1211a and the second locating pin hole 1211b are disposed at a side of the upper surface 121 of the second unit 12 that is close to the first unit 11 and are both through holes extending through the upper surface 121 and the lower surface 122. The fifth threaded hole 1213e and the sixth threaded hole 1213f are disposed at a side of the upper surface 121 of the second unit 12 that is far away from the first unit 11. In this embodiment, the fifth threaded hole 1213e and the sixth threaded hole 1213f are through holes extending through the upper surface 121 and the lower surface 122. The first through hole 1216a and the second through hole 1216b are disposed between the first locating pin hole 1211a and the fifth threaded hole 1213e, and between the second locating pin hole 1211b and the sixth threaded hole 1213f, respectively.

Figure 4:
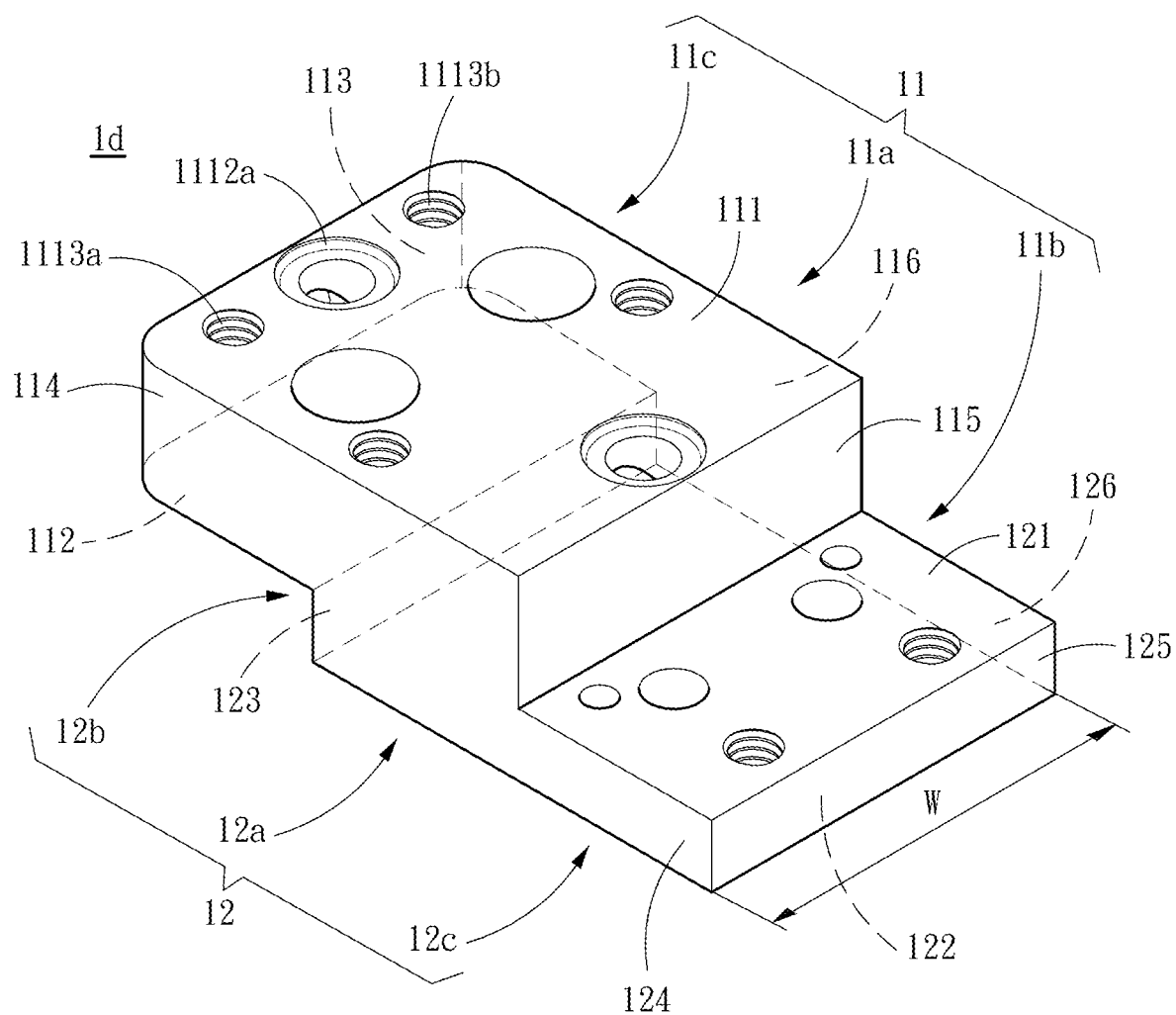
FIG. 4 is a three-dimensional diagram of a fourth embodiment of a two-port connector of the present invention.

A fourth embodiment 1d of a two-port connector of the present invention is as shown in FIG. 4. The two-port connector 1d and the two-port connector 1c differ in that the two-port connector 1d lacks the first locating pin hole 1111a, the second locating pin hole 1111b, the first lower threaded hole 1121a, and the second lower threaded hole 1121b; and the first threaded hole 1113a and the second threaded hole 1113b are relatively close to each other and symmetrically disposed about the first fluid flowing through hole 1112a. In addition, the first threaded hole 1113a, the second threaded hole 1113b and the first fluid flowing through hole 1112a are arranged in a virtual straight line. Other arrangements and structures are the same with the third embodiment 1c.

Three-Port Connectors

A three-port connector of the present invention is a connector with three flowing through holes that can be used as fluid inlets or fluid outlets. For example, in actual use, there may be one fluid inlet and two fluid outlets, or two fluid inlets and one fluid outlet; or, only two flowing through holes are used as a fluid inlet and a fluid outlet.

FIG. 5A-G show a first embodiment 2a of a three-port connector of the present invention. The three-port connector 2a has a first unit 11, a second unit 12 and an extension unit 13. The first unit 11 includes a first mounting block 11a, a first depression portion 11b and a first tongue portion 11c. The first unit 11 includes an upper surface 111, a lower surface 112 opposite to the upper surface 111, and a first side surface 113, a second side surface 114, a third side surface 115 and a fourth side surface 116 that are connected to the upper surface 111 and the lower surface 112, respectively. The first side surface 113 is disposed corresponding to the third side surface 115, while the second side surface 114 is disposed corresponding to the fourth side surface 116.

Figure 5A:
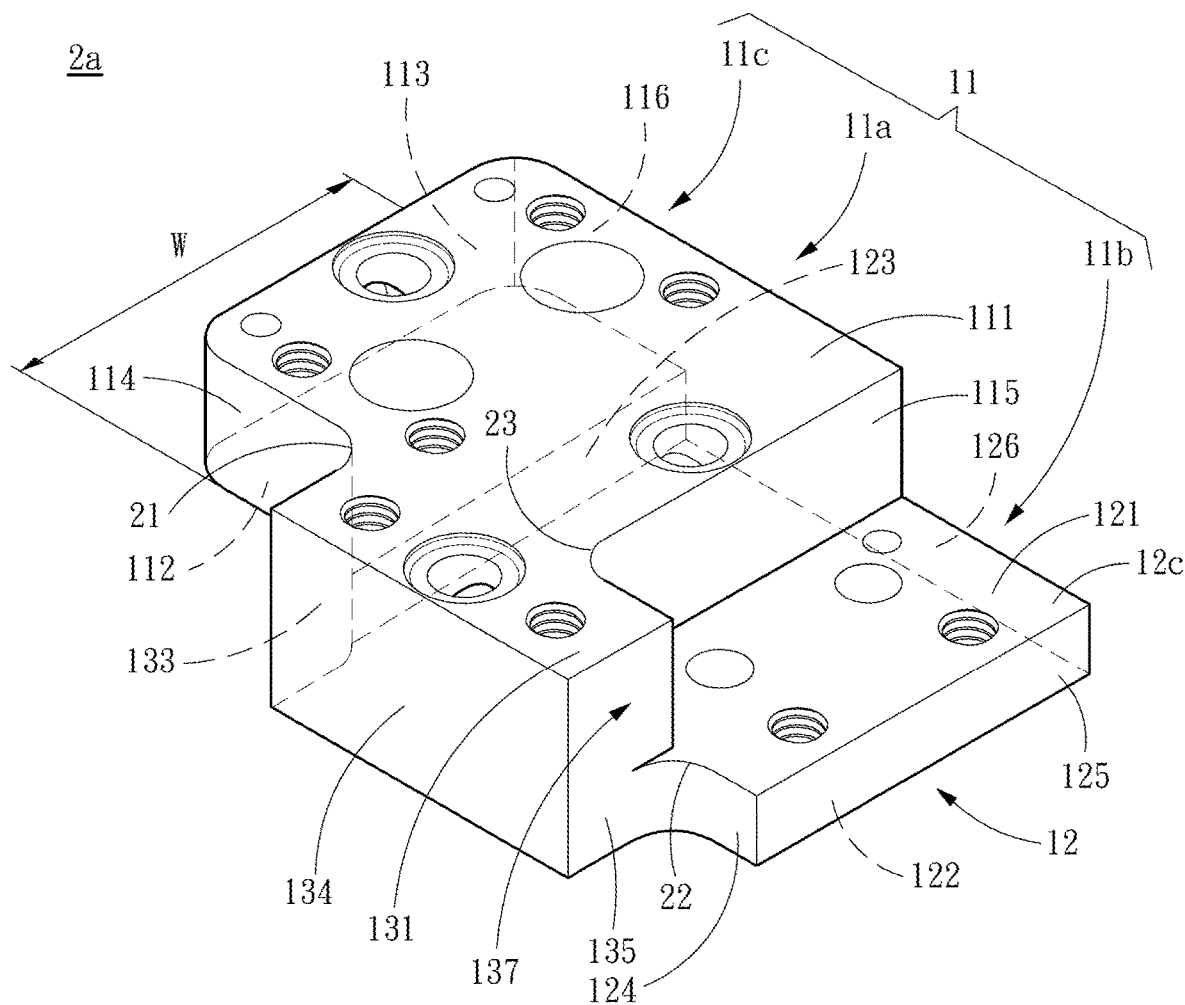
FIG. 5A is a three-dimensional diagram of a first embodiment of a three-port connector of the present invention.
Figure 5B:
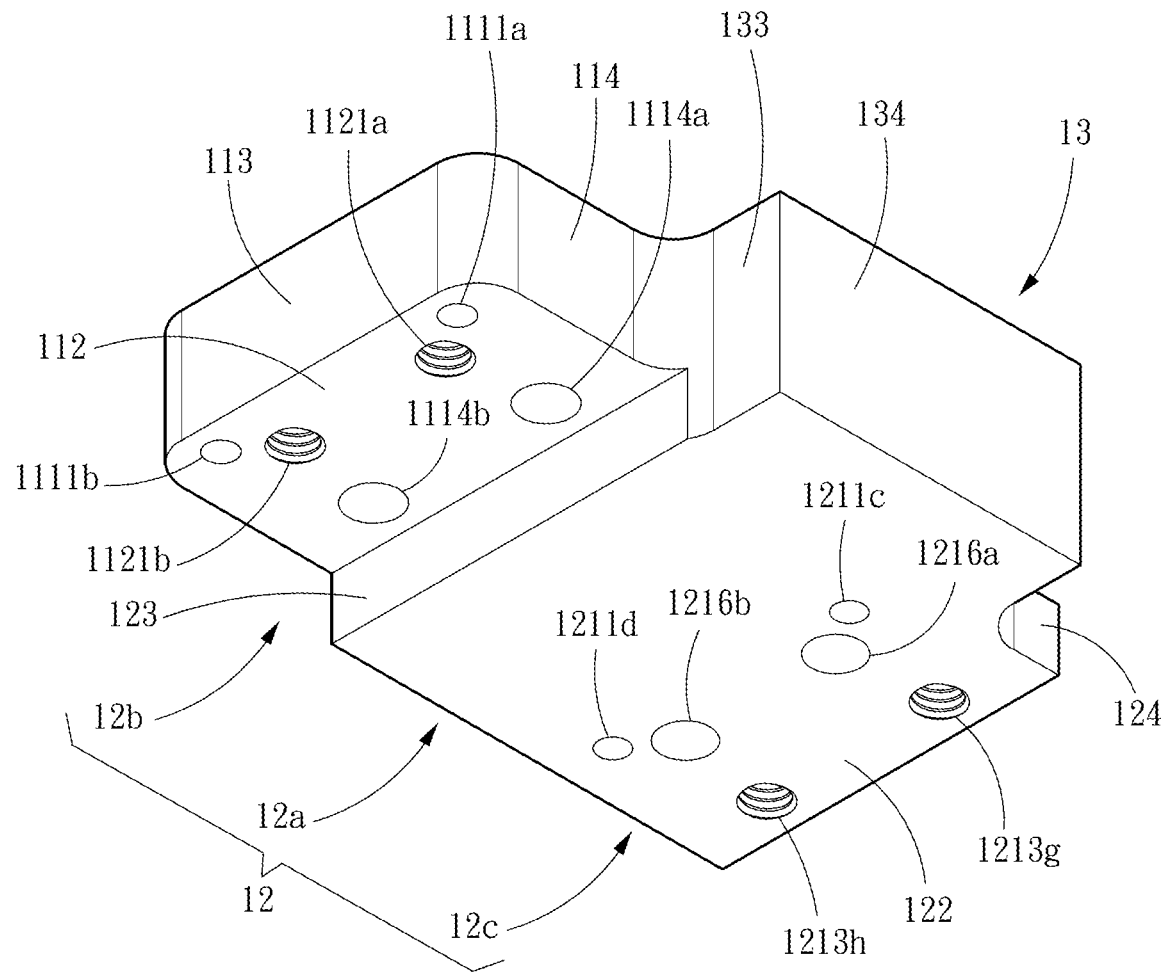
FIG. 5B is a three-dimensional diagram in another perspective of the first embodiment of the three-port connector of the present invention.
Figure 5C:
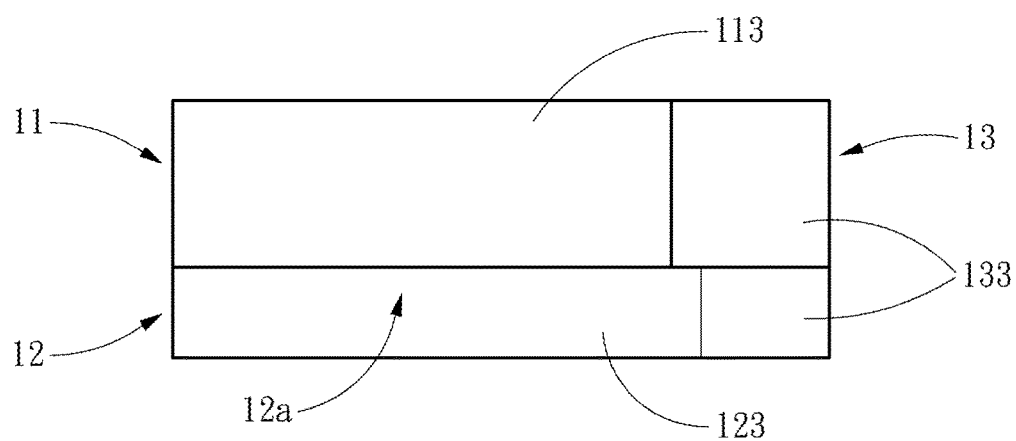
FIG. 5C is a left view of the first embodiment of the three-port connector of the present invention.
Figure 5D:
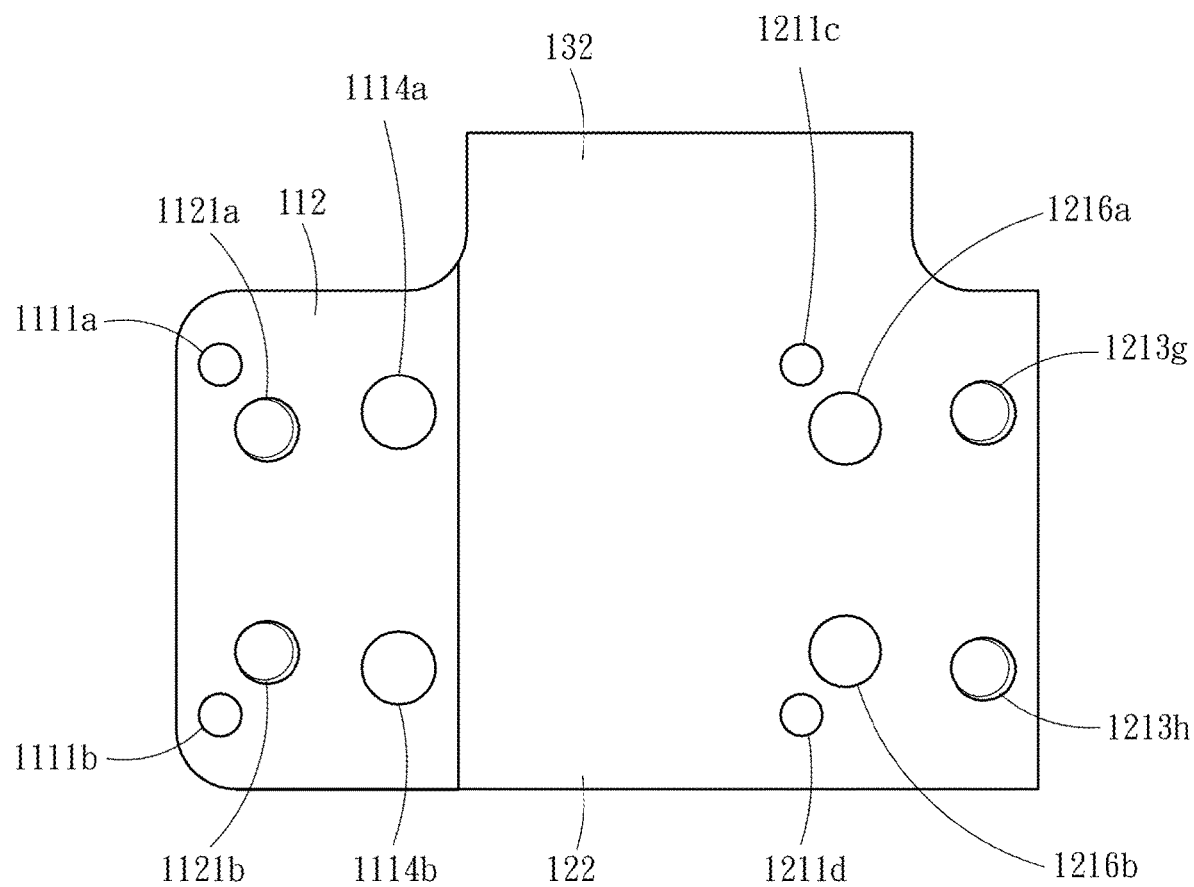
FIG. 5D is a bottom view of the first embodiment of the three-port connector of the present invention.
Figure 5E:
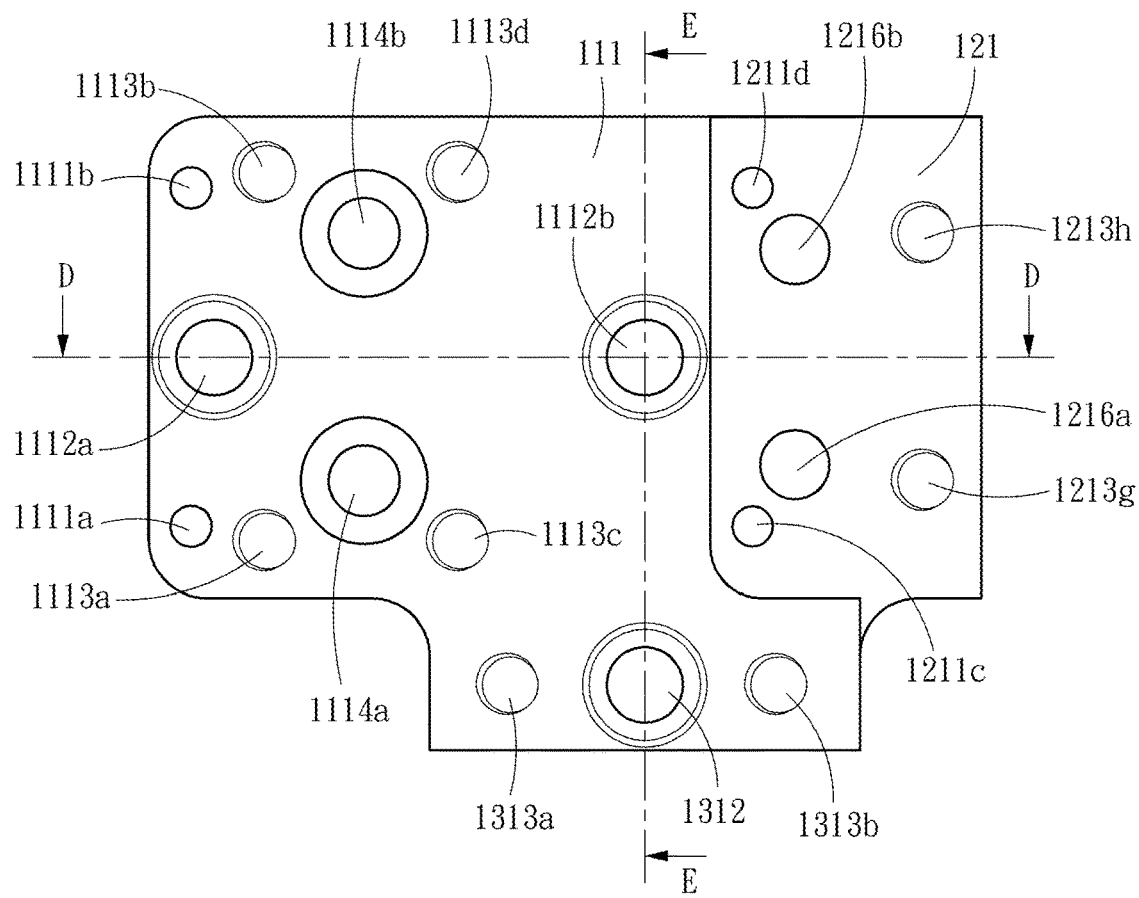
FIG. 5E is a top view of the first embodiment of the three-port connector of the present invention.
Figure 5F:
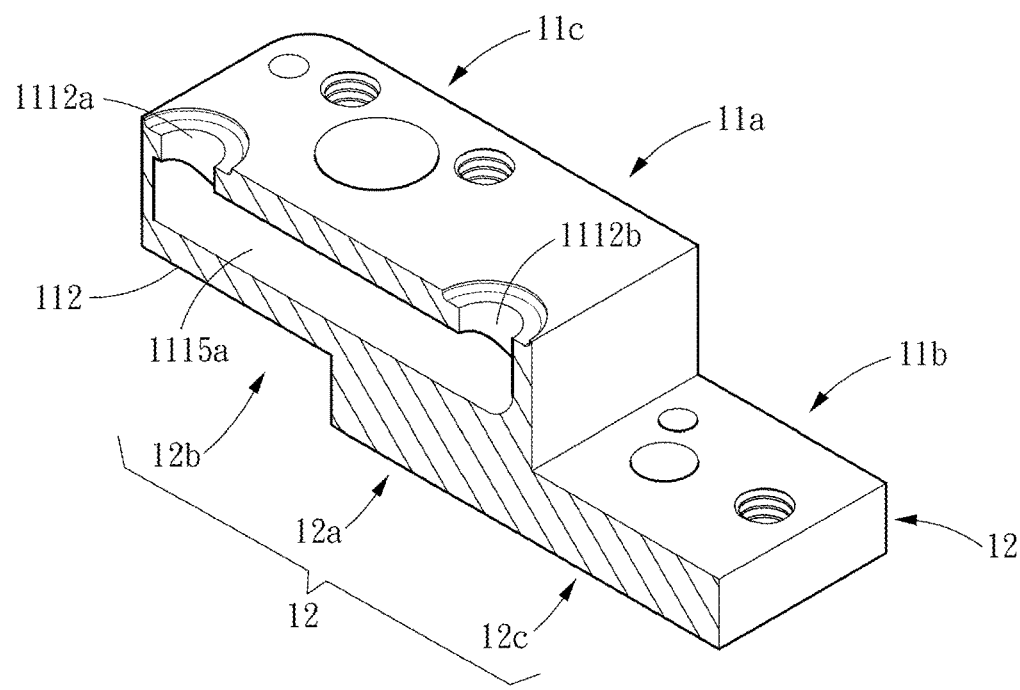
FIG. 5F is a D-D section view of FIG. 5E.
Figure 5G:
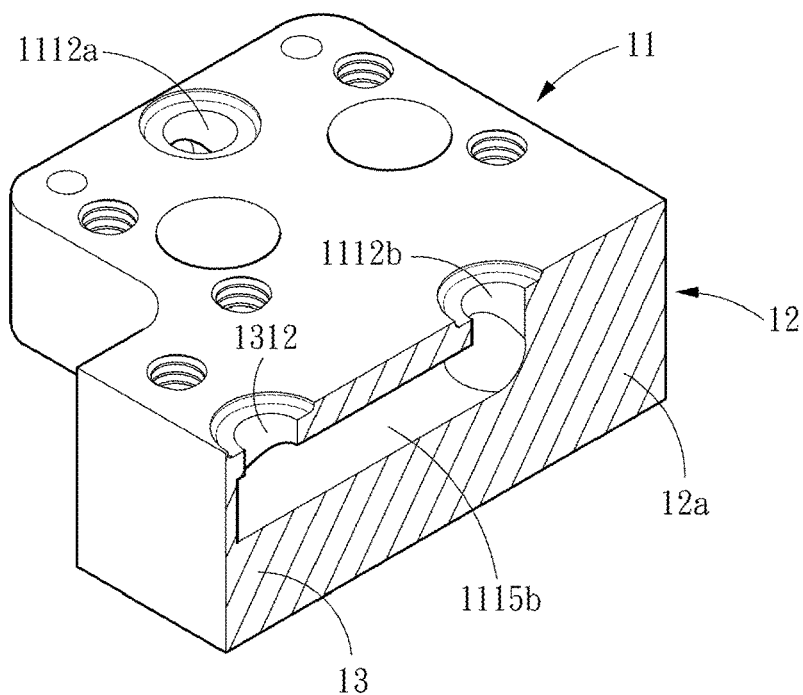
FIG. 5G is an E-E section view of FIG. 5E.

The second unit 12 includes a second mounting block 12a, a second depression portion 12b, and a second tongue portion 12c. The second mounting block 12a protrudes from a portion of the lower surface 112 of the first unit 11, and due to the existence of the second mounting block 12a, the other portion of the lower surface 112 of the first unit 11 is depressed inwards into a second depression portion 12b that is adjacent between the other portion of the lower surface 112 and the second mounting block 12a, as shown in FIG. 5B. The second tongue portion 12c extends from the second mounting block 12a toward a side far away from the second depression portion 12b to protrude from the first unit 11. The second unit 12 also has an upper surface 121, a lower surface 122 opposite to the upper surface 121, and a first side surface 123, a second side surface 124, a third side surface 125 and a fourth side surface 126 that are connected to the upper surface 121 and the lower surface 122, respectively. The first side surface 123 is disposed corresponding to the third side surface 125, and the second side surface 124 is disposed corresponding to the fourth side surface 126.

The extension unit 13 protrudes outwards from one ends of the first unit 11 and the second unit 12 that are close to the second side surfaces 114, 124. The extension unit 13 includes an upper surface 131, a lower surface 132 opposite to the upper surface 131, and a first side surface 133, a second side surface 134, a third side surface 135 and a fourth side surface 136 that are connected to the upper surface 131 and the lower surface 132, respectively. The first side surface 133 is disposed corresponding to the third side surface 135. The extension unit 13 further includes a retaining wall 137 extending and protruding in parallel to the second tongue portion 12c, as shown in FIG. 5A. A first arc-like recess portion 21 is formed between the first side surface 133 of the extension unit 13 and the second side surface 114 of the first unit 11. A second arc-like recess portion 22 is formed between the third side surface 135 of the extension unit 13 and the second side surface 124 of the second unit 12, and a third arc-like recess portion 23 is formed between the retaining wall 137 and the third side surface 115.

In this embodiment, the first unit 11, the second unit 12 and the extension unit are of an integrally formed structure, i.e., the first unit 11 and the second unit 12 have the same width W.

The first unit 11 further includes a first locating pin hole 1111a, a second locating pin hole 1111b, a first fluid flowing through hole 1112a, a second fluid flowing through hole 1112b, a first threaded hole 1113a, a second threaded hole 1113b, a third threaded hole 1113c, a fourth threaded hole 1113d, a first lower threaded hole 1121a, a second lower threaded hole 1121b, a first bolt hole 1114a, and a second bolt hole 1114b. The extension unit 13 further includes a third fluid flowing through hole 1312, a fifth threaded hole 1313a, and a sixth threaded hole 1313b.

The first locating pin hole 1111a and the second locating pin hole 1111b are both disposed at a side of the upper surface 111 that is close to the first side surface 113 and are both through holes extending through the upper surface 111 and the lower surface 112.

The first fluid flowing through hole 1112a and the second fluid flowing through hole 1112b are disposed at sides of the upper surface 111 that are close to the first side surface 113 and the third side surface 115, respectively, and the third fluid flowing through hole 1312 is disposed at a side of the upper surface 131 that is close to the second side surface 134. A first channel 1115a is disposed between the first fluid flowing through hole 1112a and the second fluid flowing through hole 1112b to communicate the first fluid flowing through hole 1112a with the second fluid flowing through hole 1112b, and a second channel 1115b is also disposed between the second fluid flowing through hole 1112b and the third fluid flowing through hole 1312 to communicate the second fluid flowing through hole 1112b with the third fluid flowing through hole 1312, where the first channel 1115a and the second channel 1115b are connected and communicate with each other and extend in directions perpendicular to each other. In other words, the fluid flowing through hole 1112a communicates with the second fluid flowing through hole 1112b and the third fluid flowing through hole 1312 through the first channel 1115a and the second channel 1115b. To avoid that a fluid remains in such channels when flowing therethrough, in this embodiment, such channels are both treated to have a mirror surface.

The first threaded hole 1113a, the second threaded hole 1113b, the third threaded hole 1113c, the fourth threaded hole 1113d, the fifth threaded hole 1313a, the sixth threaded hole 1313b, the first lower threaded hole 1121a and the second lower threaded hole 1121b are all threaded blind holes, where the first threaded hole 1113a and the second threaded hole 1113b are disposed at a side of the upper surface 111 of the first unit 11 that is close to the first side surface 113, and the first threaded hole 1113a and the second threaded hole 1113b are also disposed at the side of the upper surface 111 that is close to the first side surface 113. The third threaded hole 1113c is disposed at a side of the upper surface 111 that is close to the second side surface 114, while the fourth threaded hole 1113d is disposed at a side of the upper surface 111 that is close to the fourth side surface 116. The fifth threaded hole 1313a and the sixth threaded hole 1313b are disposed at a side of the upper surface 131 of the extension unit 13 that is close to the second side surface 134, and the third fluid flowing through hole 1312 is disposed between the fifth threaded hole 1313a and the sixth threaded hole 1313b. The first lower threaded hole 1121a and the second lower threaded hole 1121b are formed in the lower surface 112 and close to the first bolt hole 1114a and the second bolt hole 1114b.

The first bolt hole 1114a and the second bolt hole 1114b are both through holes extending through the upper surface 111 and the lower surface 112. Similar to the structure of the bolt holes as described above (please refer to FIG. 1F), a projection portion is disposed in each of the through holes, so that the through holes, i.e., the first bolt hole 1114a and the second bolt hole 1114b, have different diameters R1 and R2, where the diameter close to the upper surface 111 is R1, while the diameter close to the lower surface 112 is R2, and R1 is greater than R2. In this embodiment, the first bolt hole 1114a is disposed between the first threaded hole 1113a and the third threaded hole 1113c, and the second bolt hole 1114b is disposed between the second threaded hole 1113b and the fourth threaded hole 1113d.

The second unit 12 further includes a third locating pin hole 1211c, a fourth locating pin hole 1211d, a first through hole 1216a, a second through hole 1216b, a seventh threaded hole 1213g and an eighth threaded hole 1213h.

The third locating pin hole 1211c and the fourth locating pin hole 1211d are disposed at a side of the upper surface 121 of the second unit 12 that is close to the first unit 11 and are both through holes extending through the upper surface 121 and the lower surface 122. The seventh threaded hole 1213g and the eighth threaded hole 1213h are disposed at a side of the upper surface 121 of the second unit 12 that is far away from the first unit 11. In this embodiment, the seventh threaded hole 1213g and the eighth threaded hole 1213h are both through holes extending through the upper surface 121 and the lower surface 122. The first through hole 1216a and the second through hole 1216b are disposed close to the third locating pin hole 1211c and the seventh threaded hole 1213g and close to the fourth locating pin hole 1211d and the eighth threaded hole 1213h, respectively.

Figure 6:
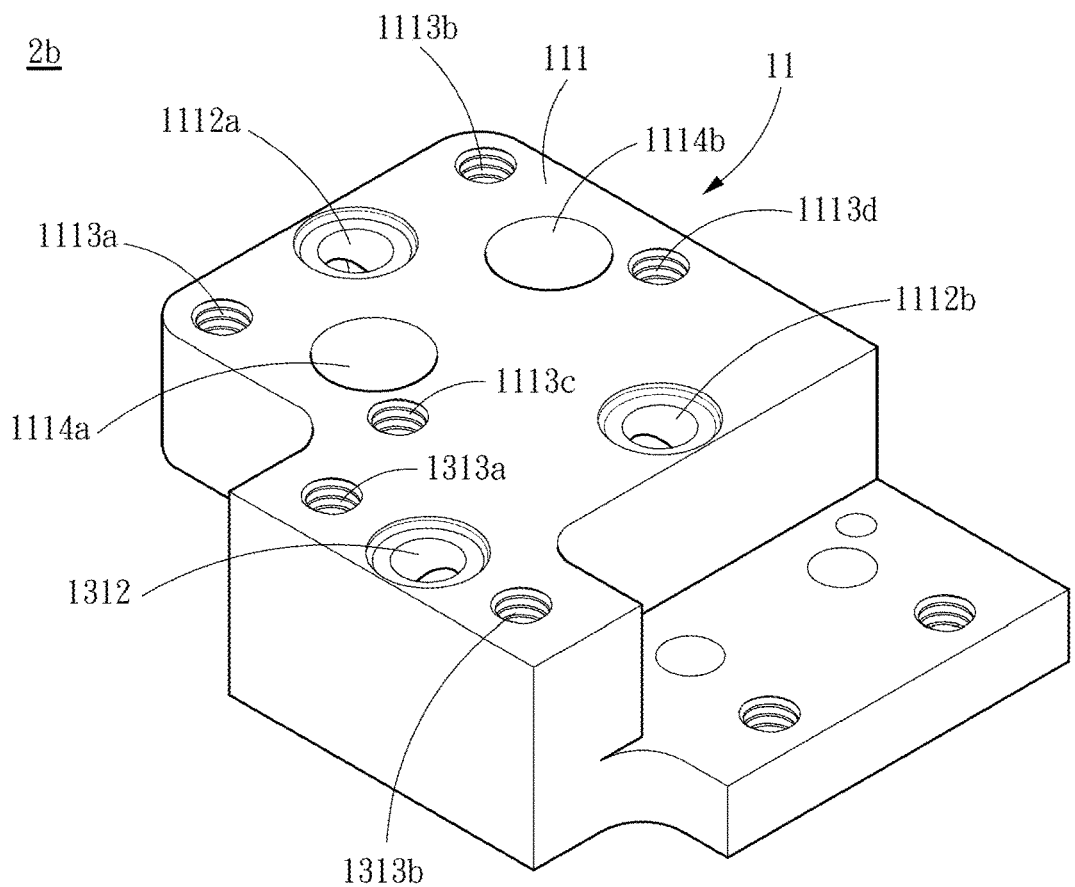
FIG. 6 is a three-dimensional diagram of a second embodiment of a three-port connector of the present invention.

A second embodiment 2b of a three-port connector of the present invention is as shown in FIG. 6. The three-port connector 2b is the same as the first embodiment 1a as described above in other arrangements and structures, except for the upper surface 111 of the first unit 11. In the three-port connector 2b, the upper surface 111 of the first unit 11 does not include the first locating pin hole 1111a and the second locating pin hole 1111b, and the positions of the first threaded hole 1113a and the second threaded hole 1113b are changed so that the two threaded holes and the first fluid flowing through hole 1112a are arranged in a virtual straight line.

Connectors with Four Ports and More than Four Ports

A connector with four ports or more than four ports of the present invention is a connector with four or more than four fluid flowing through holes as fluid inlets or fluid outlets without particular directions.

Figure 7A:
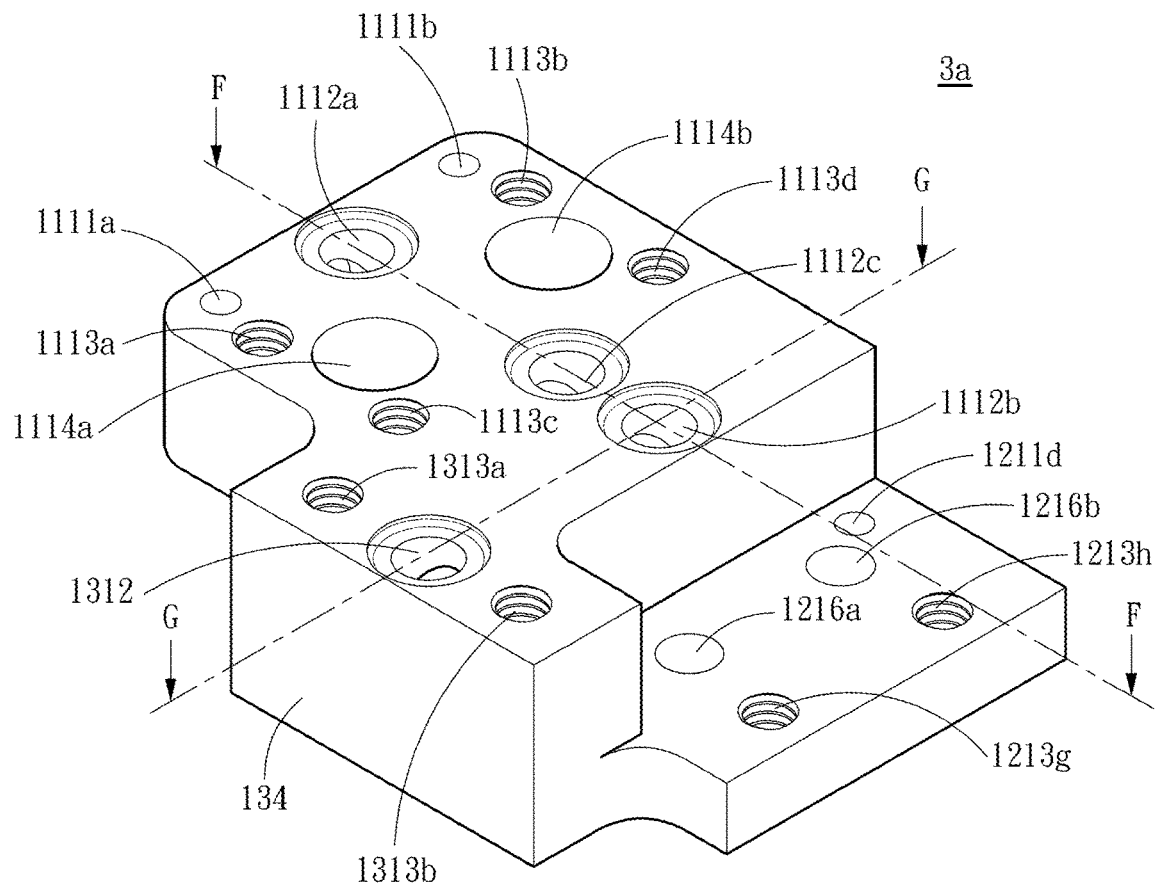
FIG. 7A is a three-dimensional diagram of a first embodiment of a connector with more than four ports of the present invention.
Figure 7B:
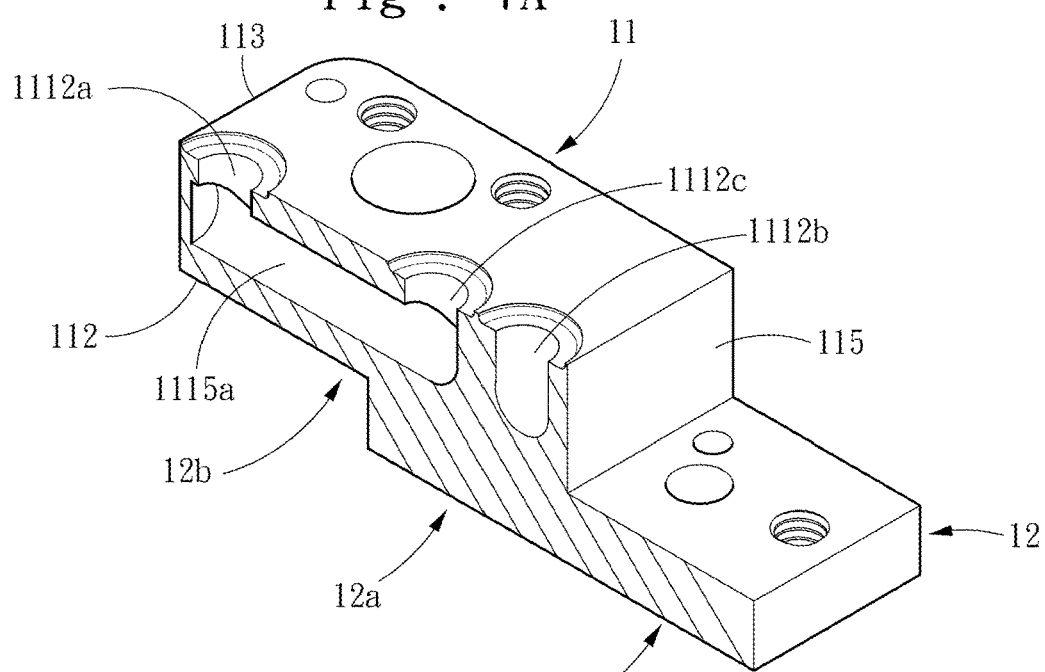
FIG. 7B is an F-F section view of FIG. 7A.
Figure 7C:
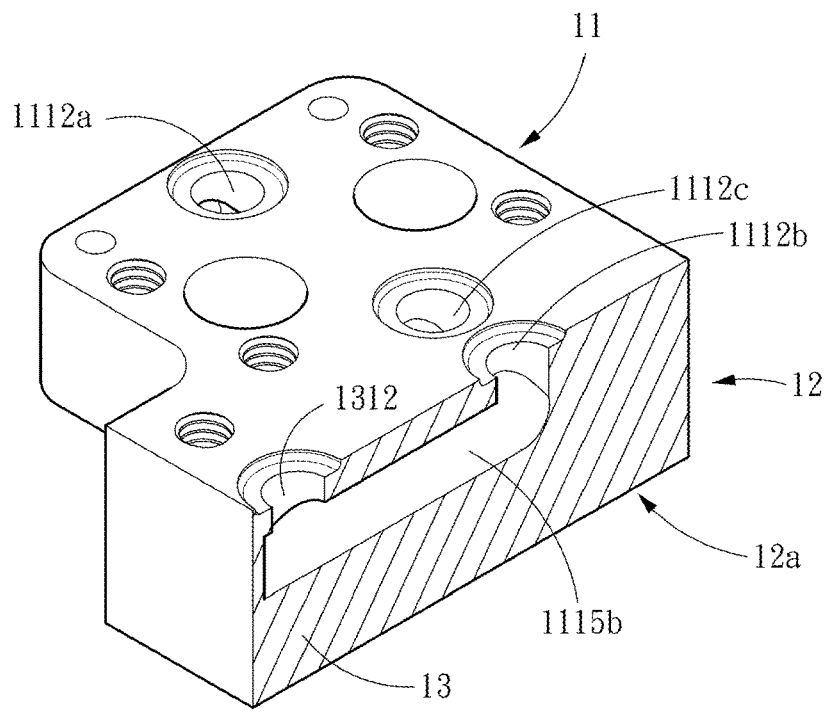
FIG. 7C is a G-G section view of FIG. 7A.

FIG. 7A-C show a first embodiment of a connector with more than four ports of the present invention. Except that the first unit 11 further includes a fourth fluid flowing through hole 1112c, other structures are the same with the three-port connector 2a as described above, so only the structure of the fluid flowing through holes will be described below while other structures may not be redundantly described.

The first fluid flowing through hole 1112a and the second fluid flowing through hole 1112b of the connector 3a with more than four ports are disposed at sides of the upper surface 111 that are close to the first side surface 113 and the third side surface 115, respectively, and the fourth fluid flowing through hole 1112c is disposed between the first fluid flowing through hole 1112a and the second fluid flowing through hole 1112b and close to the second fluid flowing through hole 1112b. In an embodiment, the first fluid flowing through hole 1112a, the second fluid flowing through hole 1112b and the fourth fluid flowing through hole 1112c are arranged in a virtual straight line in the upper surface 111. The third fluid flowing through hole 1312 is disposed at a side of the upper surface 131 of the extension unit 13 that is close to the second side surface 134, and the third fluid flowing through hole 1312 is arranged between the fifth threaded hole 1313a and the sixth threaded hole 1313b.

A first channel 1115a is disposed between the first fluid flowing through hole 1112a and the fourth fluid flowing through hole 1112c to communicate the first fluid flowing through hole 1112a with the fourth fluid flowing through hole 1112c. A second channel 1115b is also disposed between the second fluid flowing through hole 1112b and the third fluid flowing through hole 1312 to communicate the second fluid flowing through hole 1112b with the third fluid flowing through hole 1312. Unlike the channel design of the three-port connector, in this embodiment, the first channel 1115a does not communicate with the second channel 1115b, and therefore, a structure of four ports is formed. In addition, the first channel 1115a and the second channel 1115b extend in directions perpendicular to each other. To avoid that a fluid remains in such channels when flowing therethrough, in this embodiment, such channels are both treated to have a mirror surface.

Figure 8:
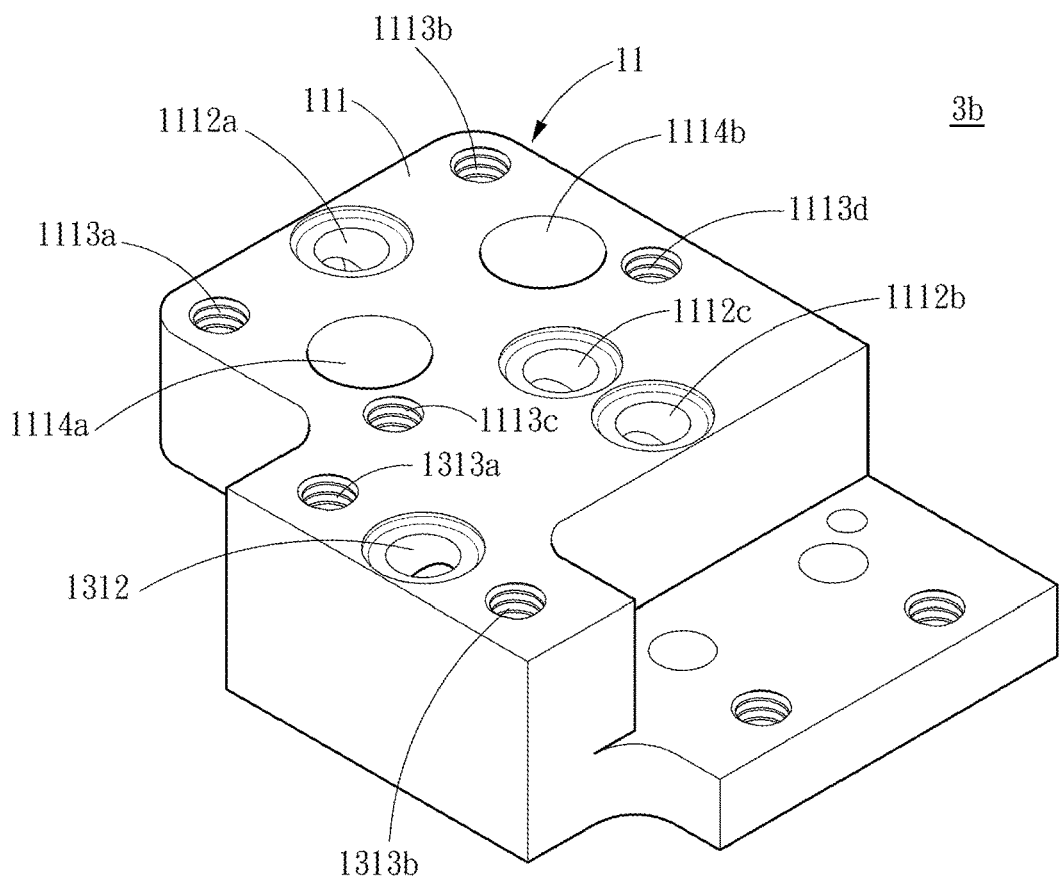
FIG. 8 is a three-dimensional diagram of a second embodiment of a connector with more than four ports of the present invention.

A second embodiment 3b of a connector with more than four ports of the present invention is as shown in FIG. 8. In the connector 3b with more than four ports, other arrangements and structures are all the same, except that the upper surface 111 of the first unit 11 is different from that of the first embodiment. In the second embodiment, there are no first locating pin hole 1111a and second locating pin hole 1111b in the upper surface 111 of the first unit 11 thereof, and the positions of the first threaded hole 1113a and the second threaded hole 1113b are changed so that the two threaded holes and the first fluid flowing through hole 1112a are arranged in a virtual straight line.

Figure 9A:
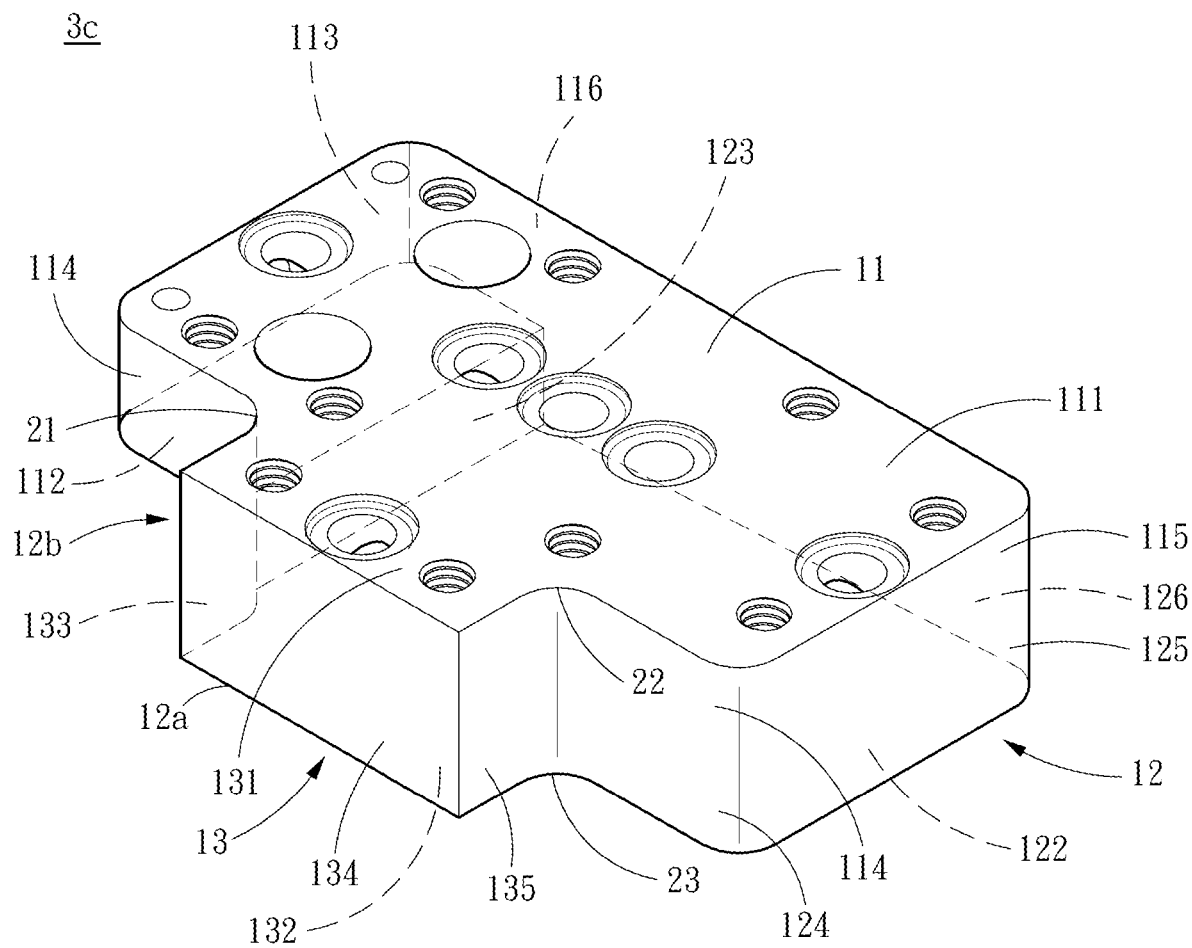
FIG. 9A is a three-dimensional diagram of a third embodiment of a connector with more than four ports of the present invention.
Figure 9B:
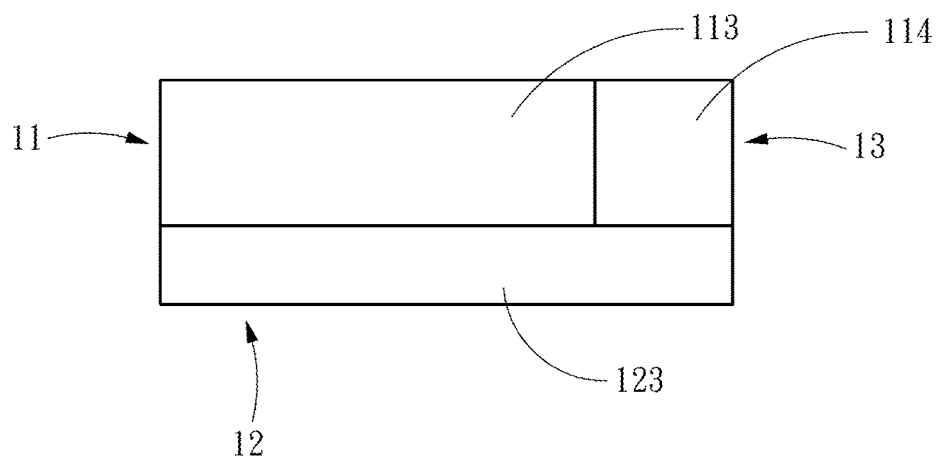
FIG. 9B is a left view of the third embodiment of the connector with more than four ports of the present invention.
Figure 9C:
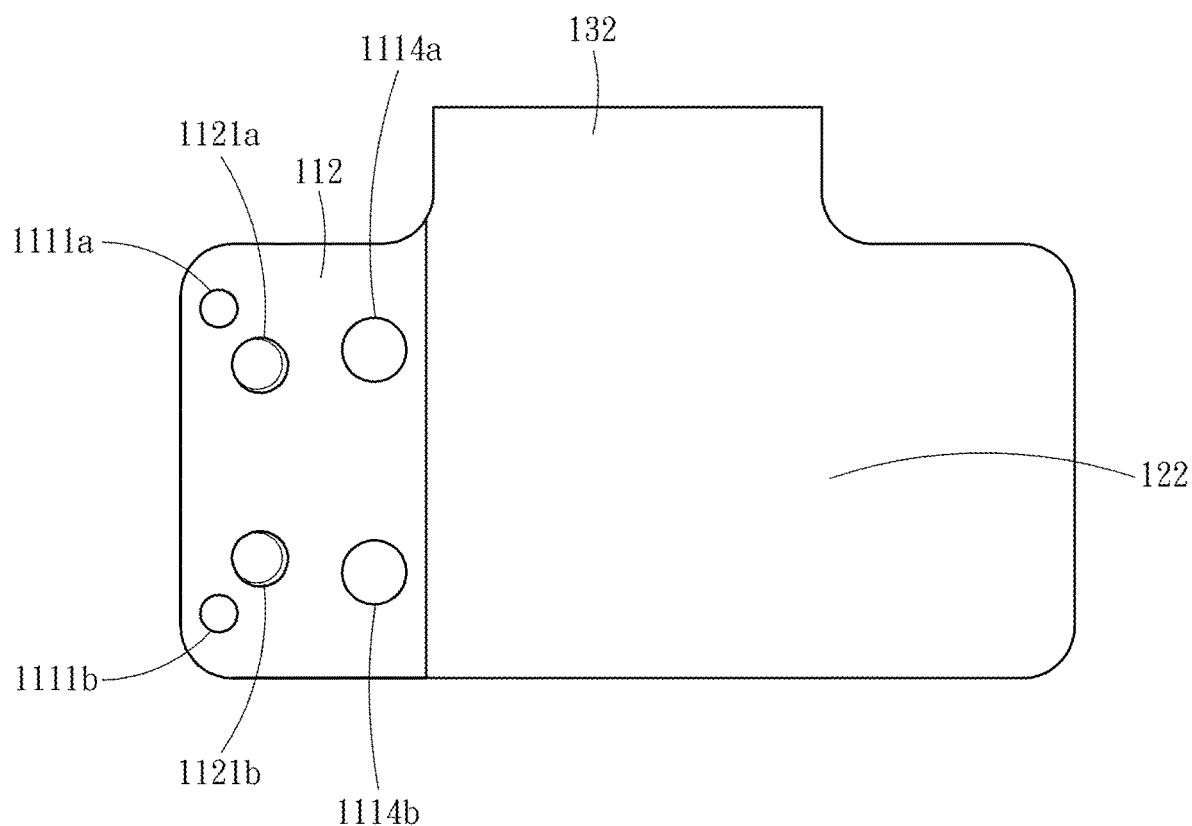
FIG. 9C is a bottom view of the third embodiment of the connector with more than four ports of the present invention.
Figure 9D:
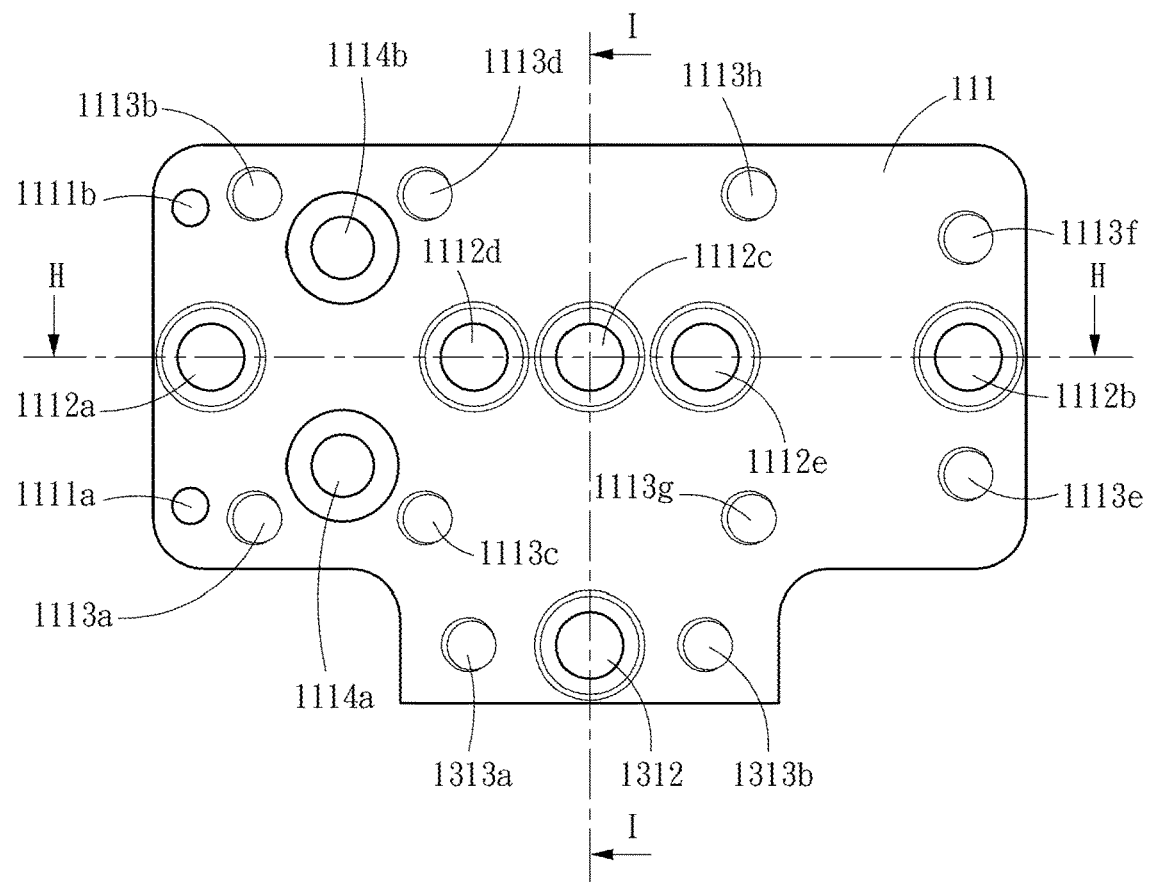
FIG. 9D is a top view of the third embodiment of the connector with more than four ports of the present invention.
Figure 9E:
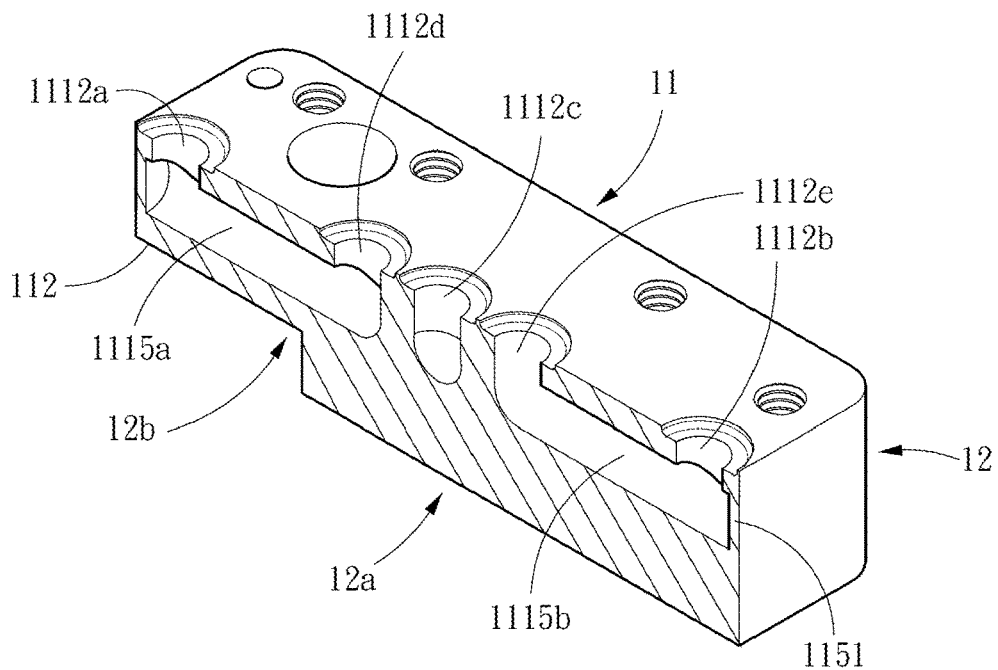
FIG. 9E is an H-H section view of FIG. 9D.
Figure 9F:
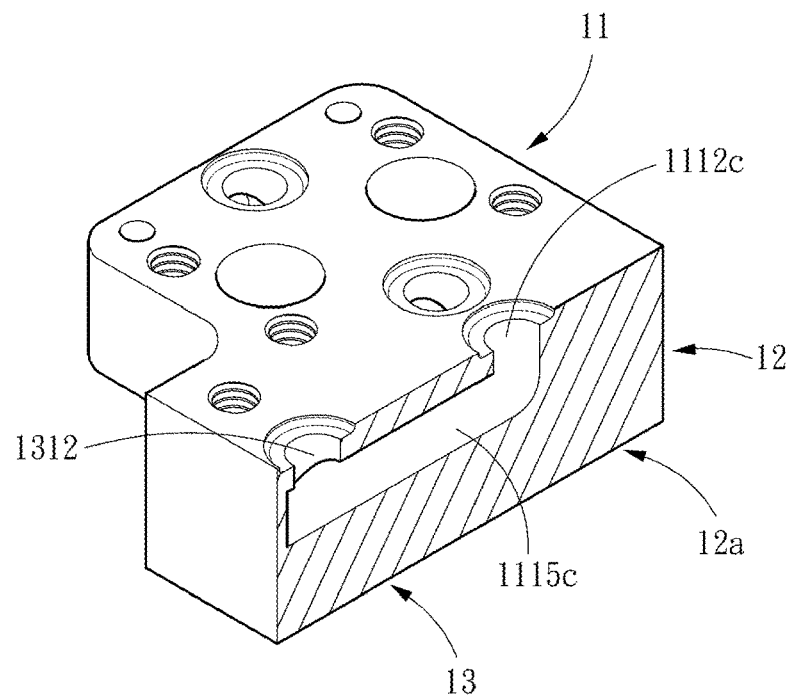
FIG. 9F is an I-I section view of FIG. 9D.

A third embodiment 3c of a connector with more than four ports of the present invention is as shown in FIG. 9A-F. A first unit 11, a second unit 12 and an extension unit 13 are included in the connector 3c with more than four ports. The first unit 11 has an upper surface 111, a lower surface 112 opposite to the upper surface 111, and a first side surface 113, a second side surface 114, a third side surface 115 and a fourth side surface 116 that are connected to the upper surface 111 and the lower surface 112, respectively. The first side surface 113 is disposed corresponding to the third side surface 115, while the second side surface 114 is disposed corresponding to the fourth side surface 116. In this embodiment, the second unit 12 includes a second mounting block 12a and a second depression portion 12b. The second mounting block 12a protrudes from a portion of the lower surface 112 of the first unit 11, and due to the existence of the second mounting block 12a, the other portion of the lower surface 112 of the first unit 11 is depressed inwards into a second depression portion 12b that is adjacent between the other portion of the lower surface 112 and the second mounting block 12a, as shown in FIG. 9E. The second unit 12 is provided with a lower surface 122, and a first side surface 123, a second side surface 124, a third side surface 125 and a fourth side surface 126 that are separately connected to the lower surface 122. The first side surface 123 is disposed corresponding to the third side surface 125, and the second side surface 124 is disposed corresponding to the fourth side surface 126.

The extension unit 13 protrudes outwards from one side ends of the first unit 11 and the second unit 12 that are close to the second side surfaces 114, 124. In this embodiment, the side ends are different from the protruding end of the second mounting block 12a. The extension unit 13 includes an upper surface 131, a lower surface 132 opposite to the upper surface 131, and a first side surface 133, a second side surface 134 and a third side surface 135 that are connected to the upper surface 131 and the lower surface 132, respectively. The first side surface 133 is disposed corresponding to the third side surface 135. A first arc-like recess portion 21 is formed between the first side surface 133 of the extension unit 13 and the second side surface 114 of the first unit 11. A second arc-like recess portion 22 is formed between the third side surface 135 of the extension unit 13 and the second side surface 114 of the first unit 11, and a third arc-like recess portion 23 is formed between the third side surface 115 and the second side surface 124 of the second unit 12.

In this embodiment, the first unit 11, the second unit 12 and the extension unit 13 are of an integrally formed structure. In this embodiment, the area of the second unit 12 is smaller than that of the first unit 11, so that the third side surface 115 of the first unit 11 is flush with the third side surface 125 of the second unit 12 to form a flat surface.

The first unit 11 further includes a first locating pin hole 1111a, a second locating pin hole 1111b, a first fluid flowing through hole 1112a, a second fluid flowing through hole 1112b, a fourth fluid flowing through hole 1112c, a fifth fluid flowing through hole 1112d, a sixth fluid flowing through hole 1112e, a first threaded hole 1113a, a second threaded hole 1113b, a third threaded hole 1113c, a fourth threaded hole 1113d, a seventh threaded hole 1113e, an eighth threaded hole 1113f, a ninth threaded hole 1113g, a tenth threaded hole 1113h, a first lower threaded hole 1121a, a second lower threaded hole 1121b, a first bolt hole 1114a, and a second bolt hole 1114b. The extension unit 13 further includes a third fluid flowing through hole 1312, a fifth threaded hole 1313a, and a sixth threaded hole 1313b. The first locating pin hole 1111a and the second locating pin hole 1111b are both disposed at a side of the upper surface 111 that is close to the first side surface 113 and are both through holes extending through the upper surface 111 and the lower surface 112.

The first fluid flowing through hole 1112a and the second fluid flowing through hole 1112b are disposed at sides of the upper surface 111 that are close to the first side surface 113 and the third side surface 115, respectively. The third fluid flowing through hole 1312 is disposed at a side of the upper surface 131 of the extension unit 13 that is close to the second side surface 134. The fourth fluid flowing through hole 1112c is disposed between the first fluid flowing through hole 1112a and the second fluid flowing through hole 1112b. The fifth fluid flowing through hole 1112d is disposed between the first fluid flowing through hole 1112a and the fourth fluid flowing through hole 1112c. The sixth fluid flowing through hole 1112e is disposed between the fourth fluid flowing through hole 1112c and the second fluid flowing through hole 1112b. Thus, the first fluid flowing through hole 1112a, the second fluid flowing through hole 1112b, the fourth fluid flowing through hole 1112c, the fifth fluid flowing through hole 1112d and the sixth fluid flowing through hole 1112e are arranged in a virtual straight line.

A first channel 1115a is disposed between the first fluid flowing through hole 1112a and the fifth fluid flowing through hole 1112d to communicate the first fluid flowing through hole 1112a with the fifth fluid flowing through hole 1112d, and a second channel 1115b is also disposed between the second fluid flowing through hole 1112b and the sixth fluid flowing through hole 1112e to communicate the second fluid flowing through hole 1112b with the sixth fluid flowing through hole 1112e. In addition, a third channel 1115c is disposed between the third fluid flowing through hole 1312 and the fourth fluid flowing through hole 1112c to communicate the third fluid flowing through hole 1312 with the fourth fluid flowing through hole 1112c. In this embodiment, the first channel 1115a, the second channel 1115b and the third channel 1115c do not communicate with each other, and therefore, a structure of six ports is formed. Additionally, the first channel 1115a and the second channel 1115b extend in directions parallel to each other, and the first channel 1115a and the third channel 1115c extend in directions perpendicular to each other. Furthermore, to avoid that a fluid remains in such channels when flowing therethrough, in this embodiment, such channels are all treated to have a mirror surface.

The first threaded hole 1113a, the second threaded hole 1113b, the third threaded hole 1113c, the fourth threaded hole 1113d, the fifth threaded hole 1313a, the sixth threaded hole 1313b, the seventh threaded hole 1113e, the eighth threaded hole 1113f, the ninth threaded hole 1113g, the tenth threaded hole 1113h, the first lower threaded hole 1121a and the second lower threaded hole 1121b are all threaded blind holes.

The first threaded hole 1113a and the second threaded hole 1113b are disposed at a side of the upper surface 111 that is close to the first side surface 113, and the first locating pin hole 1111a and the second locating pin hole 1111b are disposed between the first threaded hole 1113a and the second threaded hole 1113b and the side of the upper surface 111 that is close to the first side surface 113, respectively.

The third threaded hole 1113c and the ninth threaded hole 1113g are both disposed at a side of the upper surface 111 that is close to the second side surface 114, and the fifth threaded hole 1313a and the sixth threaded hole 1313b are disposed in the upper surface 131 of the extension unit 13 next to the second side surface 134. More particularly, the third threaded hole 1113c is disposed close to the first arc-like recess portion 21, and the ninth threaded hole 1113g is disposed close to the second arc-like recess portion 22. Moreover, the third fluid flowing through hole 1312 is disposed between the fifth threaded hole 1313a and the sixth threaded hole 1313b.

The seventh threaded hole 1113e and the eighth threaded hole 1113f are disposed at a side of the first unit 11 that is close to the third side surface 115, so that the second fluid flowing through hole 1112b is disposed between the seventh threaded hole 1113e and the eighth threaded hole 1113f.

The fourth threaded hole 1113d and the tenth threaded hole 1113h are close to the fourth side surface 116 and disposed between the second threaded hole 1113b and the eighth threaded hole 1113f, where the fourth threaded hole 1113d is disposed close to the second threaded hole 1113b, and the tenth threaded hole 1113h is disposed close to the eighth threaded hole 1113f. The first lower threaded hole 1121a and the second lower threaded hole 1121b are disposed in the lower surface 112 and close to the first bolt hole 1114a and the second bolt hole 1114b.

The first bolt hole 1114a and the second bolt hole 1114b are both through holes extending through the upper surface 111 and the lower surface 112, and a projection portion is disposed in each of the through holes, so that the through holes, i.e., the first bolt hole 1114a and the second bolt hole 1114b, have different diameters R1 and R2, where the diameter close to the upper surface 111 is R1, while the diameter close to the lower surface 112 is R2, and R1 is greater than R2 (please refer to FIG. 1F for the structure of the bolt holes). In this embodiment, the first bolt hole 1114a is disposed between the first threaded hole 1113a and the third threaded hole 1113c, and the second bolt hole 1114b is disposed between the second threaded hole 1113b and the fourth threaded hole 1113d.

Connecting Pieces

A connecting piece is used for connecting the two-port connector, the three-port connector and the connector with more than four ports as described above and a pipe, and in the present invention, two embodiments of the connecting piece will be illustrated as examples.

Figure 10A:
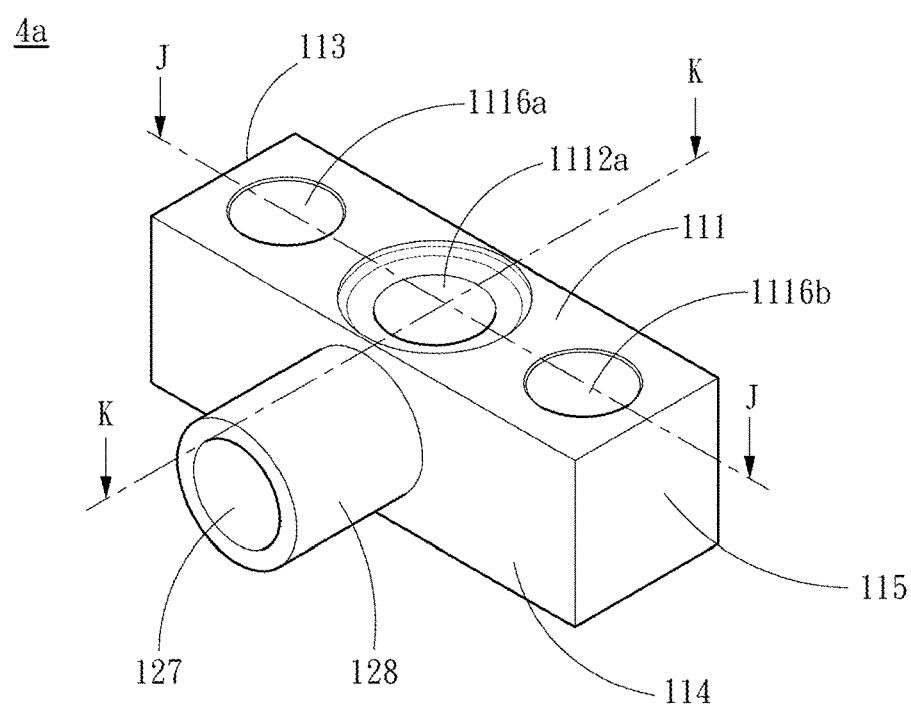
FIG. 10A is a three-dimensional diagram of a first embodiment of a connecting piece of the present invention.
Figure 10B:
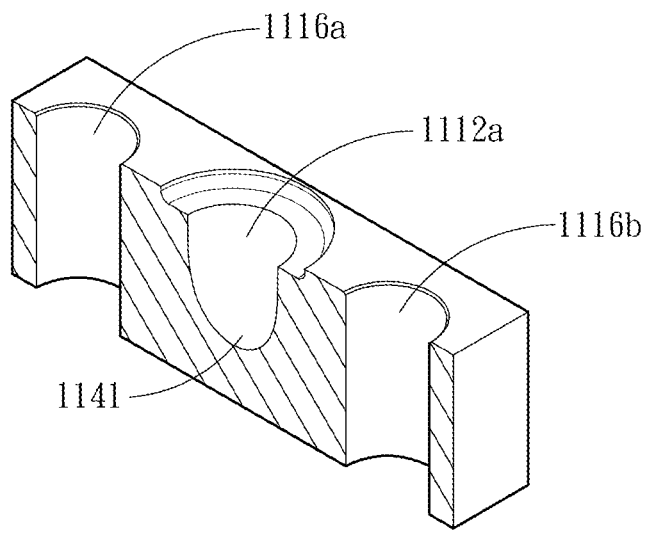
FIG. 10B is a J-J section view of FIG. 10A.
Figure 10C:
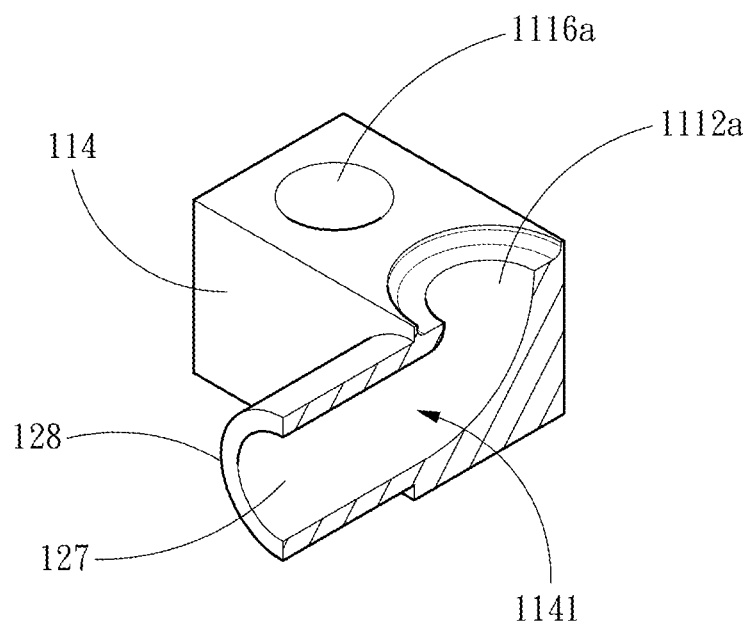
FIG. 10C is a K-K section view of FIG. 10A.

With reference to FIG. 10A-C, a first embodiment 4a of a connecting piece of the present invention is shown. The connecting piece 4a has a first unit and a second unit.

The first unit has an upper surface 111, a lower surface (not shown) opposite to the upper surface 111, and a first side surface 113, a second side surface 114, a third side surface 115 and a fourth side surface (not shown) that are connected to the upper surface 111 and the lower surface, respectively. The first side surface is disposed corresponding to the third side surface 115, and the second side surface 114 is disposed corresponding to the fourth side surface (not shown).

The upper surface 111 of the first unit includes a first through hole 1116a, a second through hole 1116b, and a first fluid flowing through hole 1112a, where the first fluid flowing through hole 1112a is disposed between the first through hole 1116a and the second through hole 1116b.

In this embodiment, the first through hole 1116a and the second through hole 1116b extend through the upper surface 111 and the lower surface (not shown), respectively, and the first fluid flowing through hole 1112a has an open end 1141 located in the second side surface 114.

The second unit is an element with a hollow tubular structure and includes an inner surface 127 and an outer surface 128, and an end of the second unit communicates with the open end 1141 of the first fluid flowing through hole 1112a.

Figure 11A:
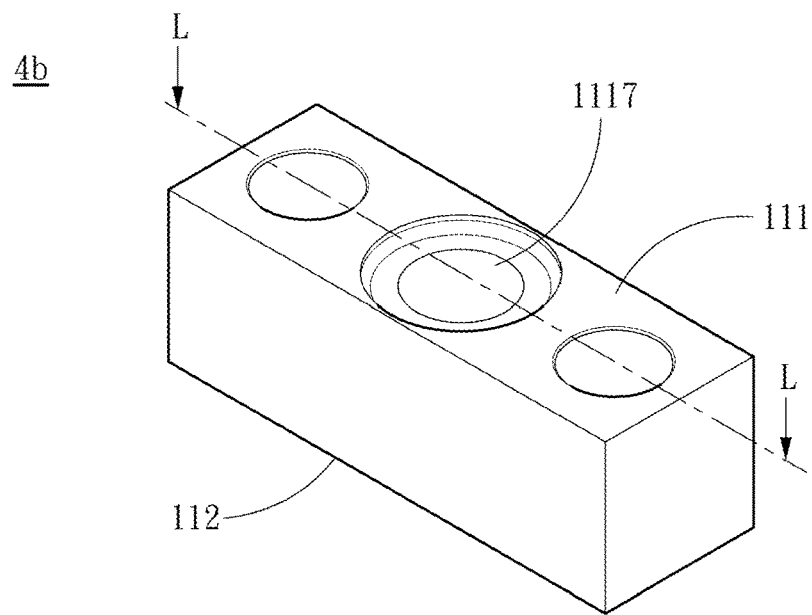
FIG. 11A is a three-dimensional diagram of a second embodiment of a connecting piece of the present invention.
Figure 11B:
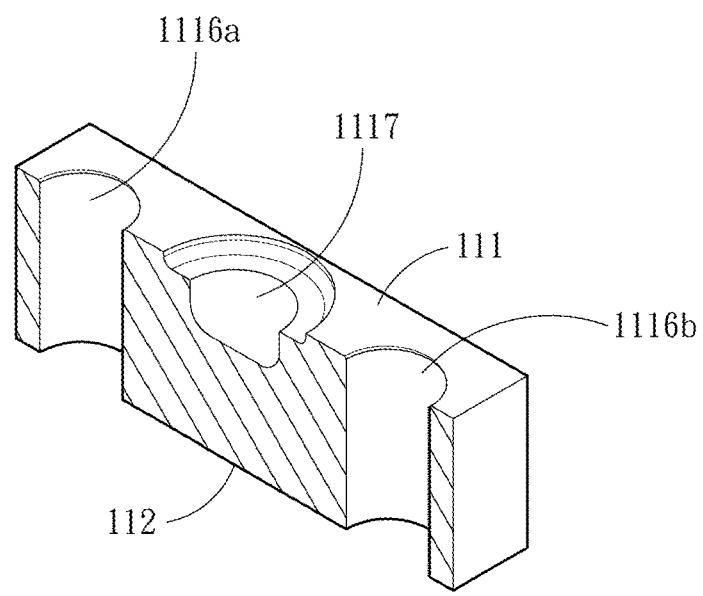
FIG. 11B is an L-L section view of FIG. 11A.

A second embodiment 4b of a connecting piece of the present invention is as shown in FIG. 11A to FIG. 11B. The connecting piece 4b includes only a first unit that has an upper surface 111 and a lower surface 112 opposite to the upper surface 111. The upper surface 111 of the first unit 11 includes a first through hole 1116a, a second through hole 1116b, and a groove 1117 that is disposed between the first through hole 1116a and the second through hole 1116b.

In this embodiment, the first through hole 1116a and the second through hole 1116b are through holes extending through the upper surface 111 and the lower surface (not shown), respectively, and the groove 1117 has a projection, allowing the groove 1117 to have different diameters, where the diameter close to the upper surface 111 is greater than the diameter close to the lower surface 112.

Fluid Control Devices

According to the present invention, a fluid control device mainly includes a base, a plurality of connecting blocks, and a plurality of fluid control elements. The plurality of connecting blocks are at least two selected from the two-port connector, the three-port connector and the connector with more than four ports as described above and thus are adjacent to each other. Next, how such connectors are combined with apparatuses to form the fluid control device of the present invention will be illustrated through specific embodiments. It needs to be noted first that the combinations of the two-port connector, the three-port connector, the connector with more than four ports and the connecting piece as described above have no particular order, and a person skilled in the art may choose any appropriate combination therefrom according to actual requirements.

For example, to assemble a filter in the fluid control device of the present invention through such connectors, the filter may be connected to two two-port connectors of the same or different embodiments; or alternatively, the filter may be connected to a two-port connector and a three-port connector. In another embodiment, to assemble a two-port shut-off valve in the fluid control device of the present invention through such connectors, one of two connectors may be selected as the two-port connector, and the other may be the two-port connector, the three-port connector, the connector with more than four ports, or the connecting piece. In further another embodiment, to assemble a three-port shut-off valve in the fluid control device of the present invention through such connectors, one of two connectors may be selected as the three-port connector, and the other may be the two-port connector, the three-port connector, the connector with more than four ports, or the connecting piece. Or, in an embodiment, the fourth embodiment 1d of the two-port connector is suitable for use at an end of a plurality of connectors, i.e., one side of the fourth embodiment 1d of the two-port connector is connected to another connector, while there is no connector at the other side.

Figure 12A:
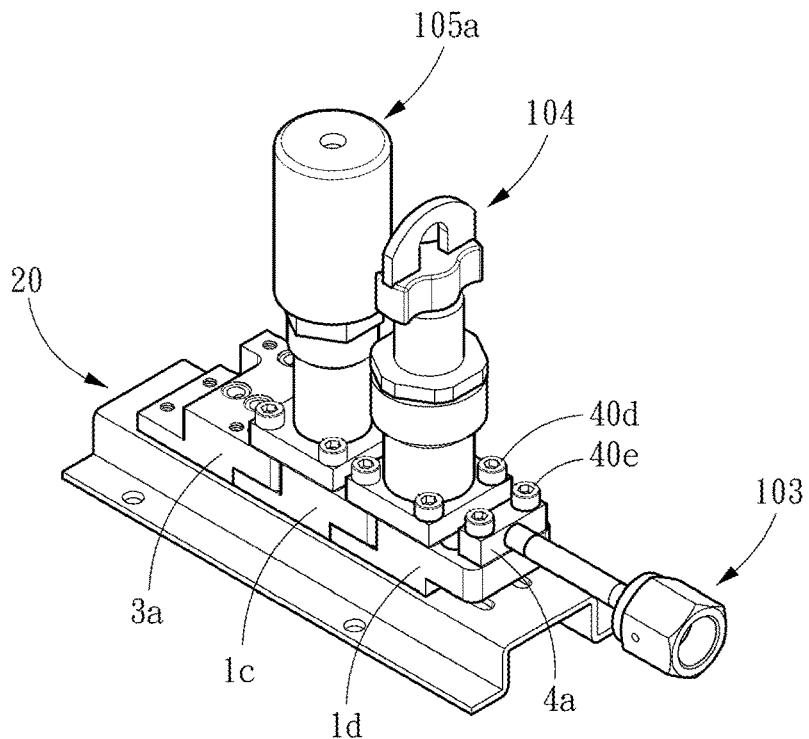
FIG. 12A is a three-dimensional diagram of a fluid control device of an embodiment of the present invention.
Figure 12B:
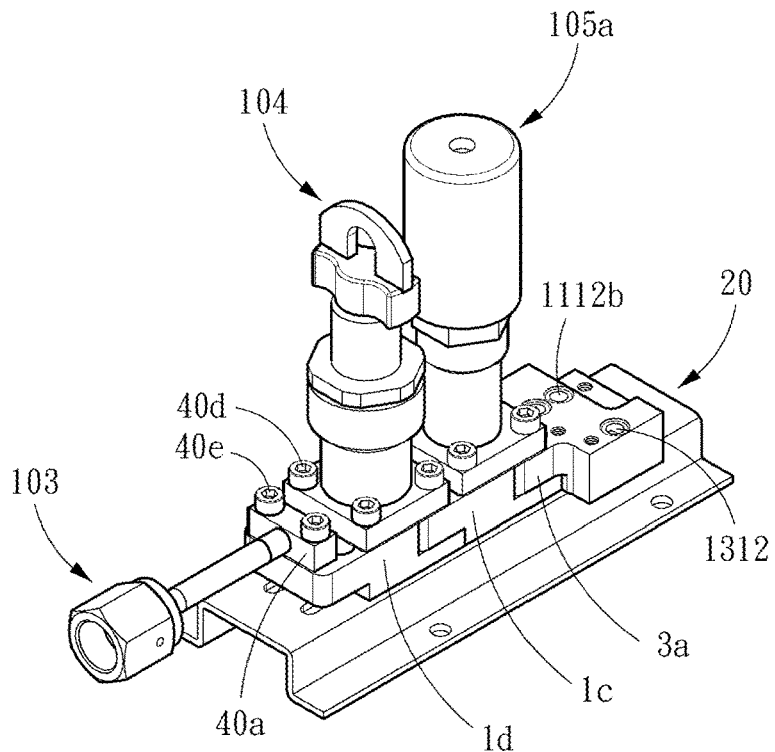
FIG. 12B is a three-dimensional diagram in another perspective of the fluid control device of an embodiment of the present invention.
Figure 12C:
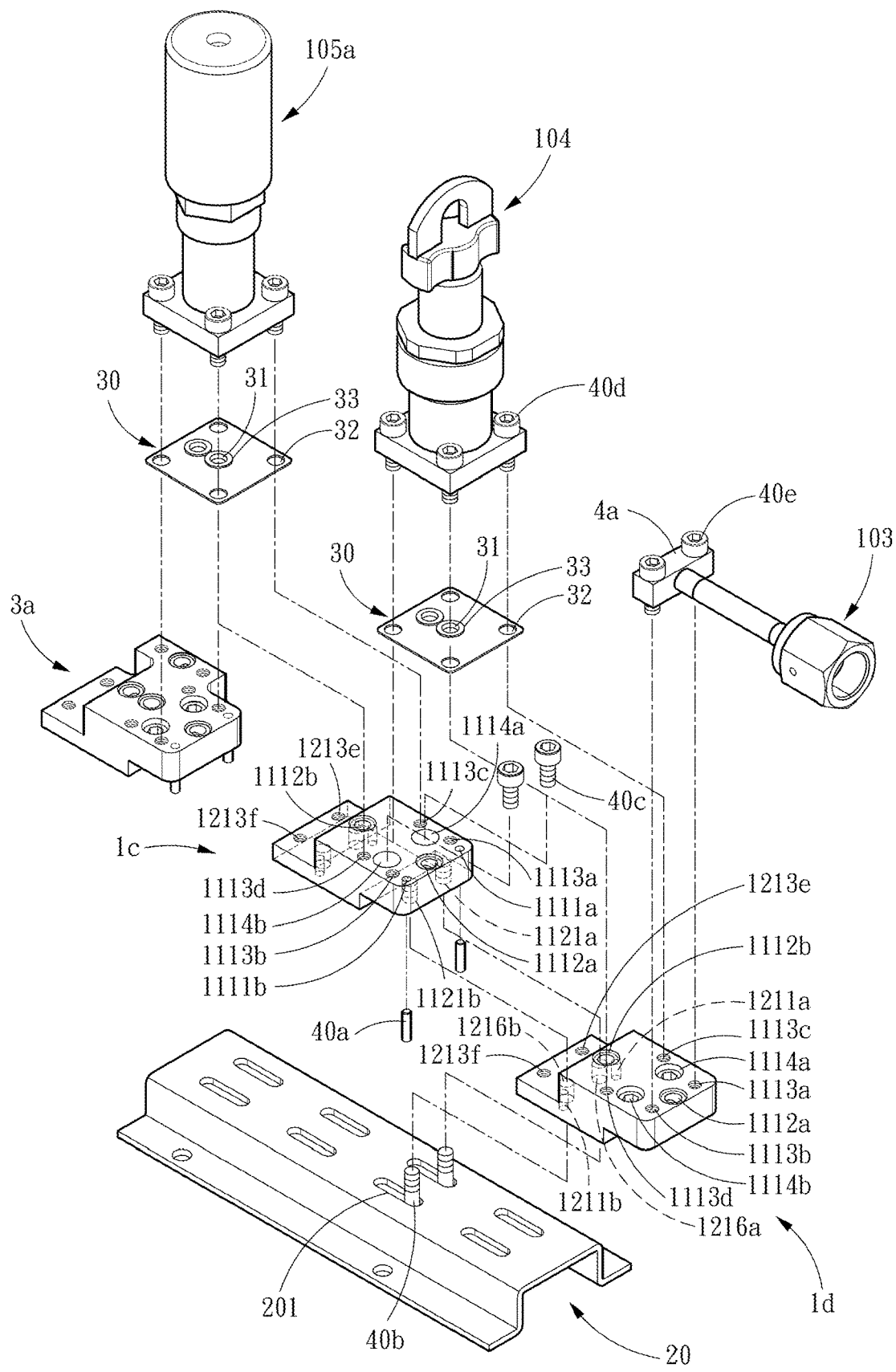
FIG. 12C is an exploded view of the fluid control device of an embodiment of the present invention.

With reference to FIG. 12A-C, an embodiment of a fluid control device of the present invention is shown that includes a base 20, a plurality of connecting blocks and a plurality of fluid control elements. The plurality of connecting blocks include a two-port connector 1d, a two-port connector 1c, and a connector 3a with more than four ports. The plurality of fluid control elements include a gas inlet element 103, a hand-operated valve 104 and a first two-port shut-off valve 105a. The plurality of connecting blocks are disposed on the base 20 and are stacked upon one another and assembled transversely, and the plurality of fluid control elements are disposed on the connecting blocks. In addition, the fluid control device further includes a plurality of sealing plates 30 that are placed between the fluid control elements and the connecting blocks and provided with a plurality of fluid through holes 31, a plurality of locating holes 32, and gaskets 33 disposed in the fluid through holes 31.

The base 20 may be made be made of a metal and include a plurality of locating grooves 201. Assembling of the plurality of connecting blocks will be illustrated with the two-port connector 1c and the two-port connector 1d by referring to FIG. 12C. The second tongue portion 12c of the second unit 12 of the two-port connector 1c is disposed in the second depression portion 12b of the second unit 12 of the two-port connector 1d, so that the third side surface 125 of the second unit 12 of the two-port connector 1d is abutted against the first side surface 123 of the second unit 12 of the two-port connector 1c. The first locating pin hole 1211a, the second locating pin hole 1211b, the first through hole 1216a, the second through hole 1216b, the fifth threaded hole 1213e and the sixth threaded hole 1213f of the two-port connector 1d are aligned to the first locating pin hole 1111a, the second locating pin hole 1111b, the first lower threaded hole 1121a, the second lower threaded hole 1121b, the first bolt hole 1114a and the second bolt hole 1114b of the two-port connector 1c, respectively.

Two first fasteners 40a extend through the first locating pin hole 1211a and the first locating pin hole 1111a, and the second locating pin hole 1211b and the second locating pin hole 1111b, respectively, so that the two-port connector 1d and the two-port connector 1c are positioned to each other. Two second fasteners 40b are put through the first through hole 1216a and the first lower threaded hole 1121a, and the second through hole 1216b and the second lower threaded hole 1121b from the locating groove 201 of the base 20, respectively, so that the two-port connector 1d and the two-port connector 1c are fixed to the base 20. Two third fasteners 40c extend through the first bolt hole 1114a and the fifth threaded hole 1213e, and the second bolt hole 1114b and the sixth threaded hole 1213f, respectively, so that the two-port connector 1d and the two-port connector 1c are locked to each other. Four fourth fasteners 40d run through a through hole of the hand-operated valve 104 and the locating holes 32 of the sealing plates 30 to be locked in the third threaded hole 1113c and the fourth threaded hole 1113d of the two-port connector 1c and the third threaded hole 1113c and the fourth threaded hole 1113d of the two-port connector 1d. In this embodiment, the first fasteners 40a are plug pins, and the second fasteners 40b, the third fasteners 40c and the fourth fasteners 40d are bolts. In addition, a plurality of fifth fasteners 40e run through a through hole of the gas inlet element 103 to be locked in the first threaded hole 1113a and the second threaded hole 1113b of the two-port connector 1d.

Figure 13:
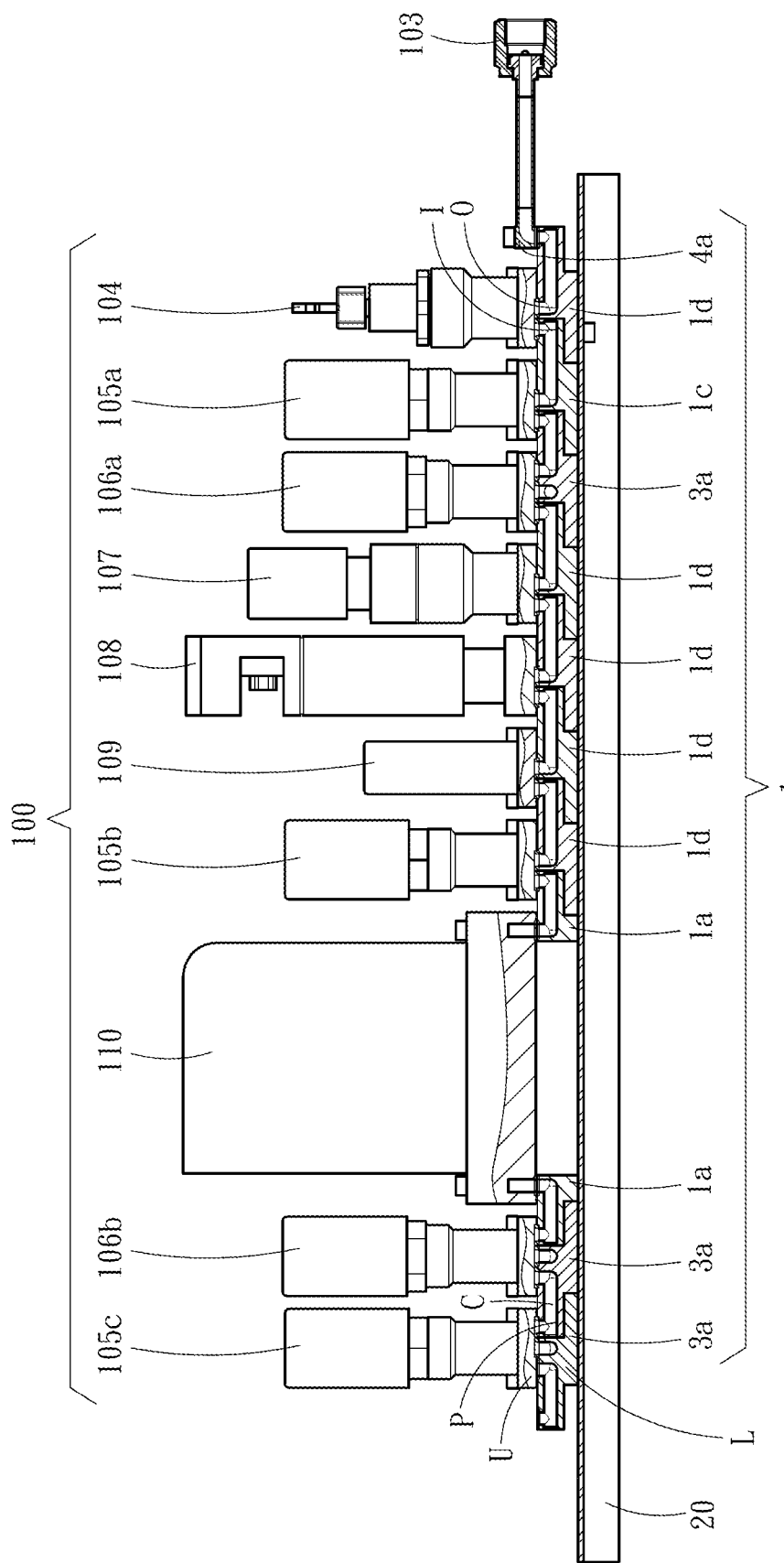
FIG. 13 is a schematic diagram of a fluid control device of another embodiment of the present invention.

With continuous reference to FIG. 13, it is a schematic diagram of a fluid control device of an embodiment of the present invention.

The fluid control device includes a base 20, a connector module 1, and a fluid control element module 100. The fluid control element module 100 includes a plurality of fluid control elements. In this embodiment, the fluid control elements to be disposed in the fluid control device from a direction where a gas enters toward a direction where the gas exits are sequentially as follows: a gas inlet element 103, a hand-operated valve 104, a first two-port shut-off valve 105a, a first three-port shut-off valve 106a, a high-cleanness pressure regulator valve 107, a pressure sensor 108, a filter 109, a second two-port shut-off valve, a mass flow controller 110, a second three-port shut-off valve 106b, and a third two-port shut-off valve 105c.

Referring to FIG. 13, the connector module 1 includes a plurality of connecting blocks that are arranged in an axial direction. Each of the plurality of connecting blocks includes an upper half portion U and a lower half portion L. The upper half portion U includes at least one fluid inlet, at least one fluid outlet, and at least one connecting channel C that communicates the fluid inlet with the fluid outlet and extends in a horizontal direction, and the lower half portion L has a depression portion and a tongue portion extending and protruding far away from the depression portion in the axial direction. In this embodiment, the connecting channel C is above an upper surface P of the tongue portion, and the connecting channel C is separated from a bottom surface of the connecting block by a height. Adjacent connecting blocks are connected to each other by accommodating the tongue portion in the depression portion. The upper half portion U has a longitudinally penetrating upper fixing hole, and the lower half portion L has a lower fixing hole longitudinally penetrating through the tongue portion and corresponding to the upper fixing hole. Adjacent connecting blocks are fixed to each other by putting at least one fastener through the upper fixing hole and the lower fixing hole. For example, in FIG. 12C, the third fasteners 40c run through the first bolt hole 1114a and the fifth threaded hole 1213e, respectively. In this embodiment, the fluid inlet, the fluid outlet and the connecting channel C form a U-shaped channel extending through a single connecting block.

Alternatively, the connector module 1 includes a plurality of connecting blocks that are arranged in an axial direction. Each of the plurality of connecting blocks includes at least one fluid inlet, at least one fluid outlet, and at least one connecting channel C that communicates the fluid inlet with the fluid outlet and extends in a horizontal direction to be separated from a bottom surface of the connecting block by a height, where a protruding first tongue portion is formed at one end of the connecting block, while a depression portion is formed at the other end thereof. Adjacent connecting blocks are connected to each other by accommodating the first tongue portion in the depression portion. In this embodiment, the protruding direction of the tongue portion is parallel to the axial direction. The first tongue portion has a longitudinally penetrating first fixing hole. A protruding second tongue portion is further formed at the other end of the connecting block, and the second tongue portion has a longitudinally penetrating second fixing hole. Adjacent connecting blocks are fixed to each other by putting a fastener through the first fixing hole and the second fixing hole. In this embodiment, the fluid inlet, the fluid outlet and the connecting channel C form a U-shaped channel extending through a single connecting block. The fluid control element is disposed above the base 20 and the connector module 1, and has an outlet O and an inlet I. The outlet O and the inlet I are connected to the fluid inlet of the connecting block and the fluid outlet of the adjacent connecting block. Such structural features of the fixing holes, the fasteners, the fluid inlet, the fluid outlet, the depression portion and the tongue portions are as shown in FIG. 1A through FIG. 9F.

The connector module 1 allows the fluid control element to be fastened to the base 20, and includes a plurality of connectors. Connectors used in FIG. 12 from a direction where a gas enters toward a direction where the gas exits are sequentially as follows: the two-port connector 1*d*, the two-port connector 1*c*, the connector 3*a* with more than four ports, the two-port connector 1*d*, the two-port connector 1*d*, the two-port connector 1*d*, the two-port connector 1*d*, the two-port connector 1*a*, the two-port connector 1*a*, the connector 3*a* with more than four ports, and the connector 3*b* with more than four ports. In the present invention, such connectors are stacked upon one another through the first units thereof and the second units of adjacent connectors to achieve the purpose of simple assembling and disassembling. In addition to this, a gas can flow between such connectors and the fluid control element, thereby reducing the risks of gas leakage.

While the present invention are described in detail above, the above are merely descriptions of preferred embodiments of the present invention and do not limit the scope of implementation of the present invention. That is, equivalent alterations, modifications and the like made within the scope of application of the present invention shall all encompassed within the patent scope of the present invention.

What is claimed is:

1. A connector for a fluid control device, comprising:
a first unit, comprising a first mounting block and a first tongue portion disposed adjacent to the first mounting block and integrally connected to the first mounting block, wherein the first unit is provided with an upper surface, a lower surface opposite to the upper surface, a first fluid flowing through hole formed in the upper surface, a second fluid flowing through hole formed in the upper surface, and a fourth fluid flowing through hole formed in the upper surface, and a first channel is disposed between the first fluid flowing through hole and the fourth fluid flowing through hole to communicate the first fluid flowing through hole with the fourth fluid flowing through hole;
an extension unit, protruding outwards from a side end of the first unit, wherein the extension unit comprises a third fluid flowing through hole, and a second channel is disposed between the third fluid flowing through hole and the second fluid flowing through hole to communicate the second fluid flowing through hole with the third fluid flowing through hole; and
a second unit, disposed under the first unit and comprising a second mounting block protruding from the lower surface of the first mounting block, a first depression portion depressed toward the lower surface of the first tongue portion, and a second tongue portion extending from the second mounting block toward a direction far away from the first depression portion;
wherein the first tongue portion of the first unit is provided with a plurality of first threaded holes formed in the upper surface and not extending through the first tongue portion, a plurality of lower threaded holes formed in the lower surface and not extending through the first tongue portion, and a plurality of bolt holes formed in the upper surface and extending through the first tongue portion;
wherein the second tongue portion of the second unit is provided with a plurality of second threaded holes extending through the second tongue portion, and a plurality of through holes extending through the second tongue portion.

2. The connector of claim 1, wherein the first channel and the second channel are independent of each other.

3. A connector for a fluid control device, comprising:
a first unit, provided with an upper surface, a lower surface opposite to the upper surface, a first fluid flowing through hole formed in the upper surface, a second fluid flowing through hole formed in the upper surface, a fourth fluid flowing through hole formed in the upper surface, a fifth fluid flowing through hole formed in the upper surface, and a sixth fluid flowing through hole formed in the upper surface, wherein a first channel is disposed between the first fluid flowing through hole and the fifth fluid flowing through hole to communicate the first fluid flowing through hole with the fifth fluid flowing through hole, and a second channel is disposed between the second fluid flowing through hole and the sixth fluid flowing through hole to communicate the second fluid flowing through hole with the sixth fluid flowing through hole;
an extension unit, protruding outwards from a side end of the first unit, wherein the extension unit comprises a third fluid flowing through hole, and a third channel is disposed between the third fluid flowing through hole and the fourth fluid flowing through hole to communicate the third fluid flowing through hole with the fourth fluid flowing through hole; and
a second unit, disposed under the first unit and comprising a mounting block protruding from a portion of the lower surface of the first unit and a first depression portion adjacent to the other portion of the lower surface and the mounting block.

4. The connector of claim 3, wherein the first channel, the second channel and the third channel are independent of one another.

* * * * *